United States Patent
Dai et al.

(10) Patent No.: US 11,387,314 B2
(45) Date of Patent: Jul. 12, 2022

(54) DISPLAY PANEL, METHOD OF MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jie Dai, Beijing (CN); Lu Bai, Beijing (CN); Pengfei Yu, Beijing (CN); Huijuan Yang, Beijing (CN); Huijun Li, Beijing (CN); Hao Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/256,597

(22) PCT Filed: Mar. 16, 2020

(86) PCT No.: PCT/CN2020/079485
§ 371 (c)(1),
(2) Date: Dec. 28, 2020

(87) PCT Pub. No.: WO2021/184159
PCT Pub. Date: Sep. 23, 2021

(65) Prior Publication Data
US 2022/0052144 A1    Feb. 17, 2022

(51) Int. Cl.
G09G 3/3266    (2016.01)
H01L 27/32     (2006.01)
(Continued)

(52) U.S. Cl.
CPC ....... *H01L 27/3276* (2013.01); *G09G 3/3225* (2013.01); *G09G 3/3266* (2013.01);
(Continued)

(58) Field of Classification Search
CPC ............... H01L 27/124; H01L 27/3276; H01L 27/3262; H01L 27/3297; H01L 27/1255;
(Continued)

(56) References Cited

U.S. PATENT DOCUMENTS 10,177,172 B2 *  1/2019  Wu ........................ G02F 1/1345
10,467,938 B1    11/2019 Xiang et al.
(Continued)

FOREIGN PATENT DOCUMENTS

CN    103646636 A    3/2014
CN    105590601 A    5/2016
(Continued)

OTHER PUBLICATIONS

United States Patent and Trademark Office, Office Action Issued in U.S. Appl. No. 17/256,563, dated Oct. 6, 2021, 19 pages.
(Continued)

*Primary Examiner* — Dismery Mercedes
(74) *Attorney, Agent, or Firm* — McCoy Russell LLP

(57) ABSTRACT

A display substrate includes a scan driving circuit and a display area arranged on a substrate, the scan driving circuit includes shift register units; the scan driving circuit includes a first/second voltage signal line and a first/second clock signal line extending along a first direction; the display area includes at least one driving transistor configured to drive a light emitting element for display; at least one shift register unit includes a signal output line, a first capacitor, and at least two transistors coupled to a same electrode plate of the first capacitor; the signal output line extends along a second direction intersecting the first direction; gate electrodes of
(Continued)

the at least two transistors are respectively coupled to the same electrode plate of the first capacitor, and the first capacitor and the at least two transistors are arranged on a same side of the first voltage signal line.

33 Claims, 9 Drawing Sheets

(51) Int. Cl.
*G09G 3/36* (2006.01)
*G09G 3/3225* (2016.01)
*H01L 51/56* (2006.01)

(52) U.S. Cl.
CPC ........... *G09G 3/3677* (2013.01); *H01L 51/56* (2013.01); *G09G 2300/0426* (2013.01); *G09G 2310/0286* (2013.01); *G09G 2310/08* (2013.01); *H01L 2227/323* (2013.01)

(58) Field of Classification Search
CPC .............. H01L 27/1259; H01L 23/642; H01L 27/3265; H01L 27/3248; H01L 27/1214; H01L 27/1218; H01L 51/56; G09G 2310/0286; G09G 2300/0408; G09G 2300/0426; G09G 3/3266; G09G 3/3674; G09G 3/3677; G09G 2310/08; G09G 3/3648; G09G 3/3225; G02F 1/13454; G02F 2201/44; G02F 2203/04103

See application file for complete search history.

(56) References Cited

U.S. PATENT DOCUMENTS

| | | | |
|---|---|---|---|
| 10,810,962 B2* | 10/2020 | Ono | G11C 19/28 |
| 2006/0022201 A1* | 2/2006 | Kim | G02F 1/1339 |
| | | | 438/151 |
| 2008/0079001 A1 | 4/2008 | Umezaki et al. | |
| 2015/0138466 A1* | 5/2015 | Mori | G02F 1/1339 |
| | | | 349/38 |
| 2016/0118409 A1* | 4/2016 | Jin | H01L 27/1248 |
| | | | 257/59 |
| 2016/0247478 A1* | 8/2016 | Ishige | G09G 3/3677 |
| 2017/0178583 A1 | 6/2017 | Zhang et al. | |
| 2019/0295472 A1* | 9/2019 | Yang | G09G 3/3291 |
| 2019/0340969 A1* | 11/2019 | Hu | G09G 3/3266 |
| 2021/0202659 A1* | 7/2021 | Lee | H01L 27/3276 |
| 2021/0295780 A1* | 9/2021 | Ikeda | G09G 3/3275 |
| 2021/0313415 A1* | 10/2021 | Ma | H01L 27/3218 |

FOREIGN PATENT DOCUMENTS

| | | |
|---|---|---|
| CN | 108182921 A | 6/2018 |
| CN | 110364125 A | 10/2019 |
| KR | 20140147203 A | 12/2014 |

OTHER PUBLICATIONS

United States Patent and Trademark Office, Office Action Issued in U.S. Appl. No. 17/256,563, dated Mar. 3, 2022, 27 pages.

* cited by examiner

DISPLAY PANEL, METHOD OF MANUFACTURING THE SAME, AND DISPLAY DEVICE

CROSS REFERENCE TO RELATED APPLICATION

The present application is a U.S. National Phase of International Application No. PCT/CN2020/079485 entitled "DISPLAY PANEL, METHOD OF MANUFACTURING THE SAME, AND DISPLAY DEVICE," and filed on Mar. 16, 2020. The entire contents of the above-listed application are hereby incorporated by reference for all purposes.

TECHNICAL FIELD

The present disclosure relates to the field of display technology, in particular to a display panel, a method of manufacturing a display panel and a display device.

BACKGROUND

Active-Matrix Organic light emitting Diode (AMOLED) display panels are widely used in various fields due to their low power consumption, low production cost, and wide color gamut.

The AMOLED display panel includes a pixel circuit located in a display area and a scan driving circuit located in an edge area. The pixel circuit includes a plurality of sub-pixel circuits, and the scan driving circuit includes a plurality of shift register units. Each shift register unit is used to provide a light emitting control signal to a corresponding sub-pixel circuit. Since the scan driving circuit is arranged in the edge area of the AMOLED display panel, the frame width of the AMOLED display panel is determined by the arrangement of the scan driving circuit.

SUMMARY

In a first aspect, a display substrate includes a scan driving circuit and a display area arranged on a substrate, wherein the scan driving circuit includes a plurality of shift register units; the scan driving circuit further includes a first voltage signal line, a second voltage signal line, a first clock signal line, and a second clock signal line; the first voltage signal line, the second voltage signal line, the first clock signal line, and the second clock signal line extend along a first direction; the display area includes at least one driving transistor configured to drive a light emitting element for display; at least one shift register unit of the plurality of shift register units includes a signal output line, a first capacitor, and at least two transistors coupled to a same electrode plate of the first capacitor; the signal output line extends along a second direction, the first direction intersects the second direction; gate electrodes of the at least two transistors are respectively coupled to the same electrode plate of the first capacitor, and both the first capacitor and the at least two transistors are arranged on a same side of the first voltage signal line.

Optionally, a maximum distance in the second direction between an orthographic projection of the gate electrodes of the at least two transistors on the substrate and an orthographic projection of the first voltage signal line on the substrate is less than a first predetermined distance.

Optionally, the first predetermined distance is greater than or equal to 30 microns and less than or equal to 40 microns.

Optionally, the at least two transistors comprise a first capacitor connection transistor and a second capacitor connection transistor; a gate electrode the first capacitor connection transistor and a gate electrode the second capacitor connection transistor are respectively coupled to a second electrode plate of the first capacitor; the at least one shift register unit further includes a first conductive connection portion coupled to the second electrode of the first capacitor connection transistor, and an orthographic projection of the first conductive connection portion on the substrate and an orthographic projections of a first electrode plate of the first capacitor on the substrate have a first overlapping area, and the first conductive connection portion is coupled to the first electrode plate of the first capacitor through at least one first via hole provided in the first overlapping.

Optionally, the at least one shift register unit includes a second transistor; the at least one shift register unit further includes a gate connection conductive portion coupled to a gate electrode of the second transistor, and a first electrode connection conductive portion coupled to a first electrode of the first capacitor connection transistor; the gate connection conductive portion and the first electrode connecting conductive portion have a connection overlapping area; the gate connection conductive portion is coupled to the first electrode connection conductive portion through a connection via hole provided in the connection overlapping area; a second electrode of the second transistor is coupled to the first conductive connection portion.

Optionally, a first electrode of the second capacitor connection transistor is coupled to the first voltage signal line; a maximum distance in the second direction between an orthographic projection of the gate electrode of the first capacitor connection transistor on the substrate and the orthographic projection of the first voltage signal line on the substrate is smaller than a maximum distance in the second direction between an orthographic projection of the gate electrode of the second capacitor connection transistor on the substrate and the orthographic projection of the first voltage signal line on the substrate.

Optionally, a maximum distance in the second direction between the gate electrode of the first capacitor connection transistor and the gate electrode of the second capacitor connection transistor is less than a second predetermined distance; an orthographic projection of the first electrode plate of the first capacitor on the substrate is within an orthographic projection of the second electrode plate of the first capacitor on the substrate; the first electrode plate of the first capacitor is of an L shape.

Optionally, the at least one shift register unit includes a first transistor; the first electrode plate of the first capacitor includes a first horizontal plate portion and a first vertical plate portion; the gate electrode of the second capacitor connection transistor and the first horizontal plate portion are arranged along a first direction; a gate electrode of the first transistor, the gate electrode of the second transistor, and the first vertical plate portion are arranged along a first direction; the first vertical plate portion is located between the first capacitor connection transistor and the second capacitor connection transistor.

Optionally, the first capacitor connection transistor comprises a first active pattern; the first active pattern extends along the first direction; the first active pattern includes two first capacitor connection conductive portions arranged opposite to each other in the first direction, and a first capacitor connection channel portion located between the two first capacitor connection conductive portions.

Optionally, the first voltage signal line is located on a side of the second voltage signal line away from the display area.

Optionally, the display substrate further includes a third voltage signal line; wherein the third voltage signal line is located on a side of the first voltage signal line away from the second voltage signal line; the first capacitor and the at least two transistors coupled to the same electrode plate of the first capacitor are located between the first voltage signal line and the third voltage signal line.

Optionally, the at least one shift register unit further comprises a first node control transistor and a second capacitor; a gate electrode of the first node control transistor is coupled to the second electrode plate of the second capacitor; an orthographic projection of the first electrode plate of the second capacitor on the substrate is within an orthographic projection of the second electrode plate of the second capacitor on the substrate; the first electrode plate of the second capacitor is of an L shape; the first electrode plate of the second capacitor includes a second horizontal plate portion; an orthographic projection of the gate electrode of the first node control transistor on the substrate and an orthographic projection of the second horizontal plate portion on the substrate are arranged in a first direction.

Optionally, the scan driving circuit further comprises a third voltage signal line; the third voltage signal line extends along the first direction; the third voltage signal line is located on a side of the first voltage signal line away from the display area; the first node control transistor is located between the third voltage signal line and the first voltage signal line; the first electrode plate of the second capacitor further includes a second vertical plate portion coupled to the second horizontal plate portion; an orthographic projection of the second vertical plate portion on the substrate partially overlaps an orthographic projection of the third voltage signal line on the substrate.

Optionally, the at least one shift register unit includes an output circuit; the first clock signal line is located on a side of the third voltage signal line away from the first voltage signal line; the output circuit includes an output transistor; the at least one shift register unit further includes a second conductive connection portion arranged between a gate electrode of the output transistor and the second electrode plate of the second capacitor; the second conductive connection portions are respectively coupled to the gate electrode of the output transistor and the second electrode plate of the second capacitor; the at least one shift register unit further includes a third conductive connection portion coupled to the second electrode plate of the second capacitor; an orthographic projection of the third conductive connection portion on the substrate and the orthographic projection of the first clock signal line on the substrate have a sixth overlapping area, and the first clock signal line is coupled to the first electrode plate of the second capacitor through at least one sixth via hole provided in the sixth overlapping area.

Optionally, the first node control transistor comprises a second active pattern, the second active pattern is of a U shape; the second active pattern includes a first one of first node control channel portions, a second one of first node control channel portions, and a first one of first node control conductive portions coupled to the first one of first node control channel portions; and a second one of first node control conductive portions coupled to the second one of first node control channel portions; the gate electrode the first node control transistor includes a first gate pattern and a second gate pattern that are coupled to each other; the first gate pattern corresponds to the first one of first node control channel portions, and the second gate pattern corresponds to the second one of first node control channel portions; the first one of first node control conductive portions corresponds to a second electrode of the first node control transistor, and the second one of first node control conductive portions corresponds to a first electrode of the first node control transistor.

Optionally, the at least one shift register unit further comprises a second node control transistor; the at least one shift register unit comprises a second capacitor connection transistor; a second electrode of the second node control transistor and the second electrode of the first node control transistor are coupled through a fourth conductive connection portion; the at least one shift register unit further includes a fifth conductive connection portion coupled to a gate electrode of the second capacitor connection transistor; an orthographic projection of the fifth conductive connection portion on the substrate and an orthographic projections of the fourth conductive connection portion on the substrate have a seventh overlapping area; the fifth conductive connection portion is coupled to the fourth conductive connection portion through a seventh via hole provided in the seventh overlapping area.

Optionally, the scan driving circuit further comprises a third voltage signal line; the third voltage signal line is located on a side of the first voltage signal line away from the display area; the first electrode of the first node control transistor is coupled to a sixth conductive connection portion; the gate electrode of the second node control transistor is coupled to a seventh conductive connection portion; an orthographic projection of the sixth conductive connection portion on the substrate and an orthographic projection of the seventh conductive connection portion on the substrate have an eighth overlapping area, and the sixth conductive connection portion is coupled to the seventh conductive connection portion through an eighth via hole provided in the eighth overlapping area; the first electrode of the second node control transistor is coupled to the third voltage signal line.

Optionally, the gate electrode of the second node control transistor is coupled to an eighth conductive connection portion; an orthographic projection of the eighth conductive connection portion on the substrate and the orthographic projection of the second clock signal line on the substrate have a ninth overlapping area, and the eighth conductive connection portion is coupled to the second clock signal line through a ninth via hole provided in the ninth overlapping area.

Optionally, the scan driving circuit comprises a third voltage signal line; the third voltage signal line extends along the first direction; an orthographic projection of the third voltage signal line on the substrate, an orthographic projection of the first clock signal line on the substrate, and an orthographic projection of the second clock signal line on the substrate are all located on a side of an orthographic projection of the plurality of shift register units on the substrate away from the display area of the display substrate; the first clock signal line, the second clock signal line, and the third voltage signal line are arranged in sequence along a direction close to the display area; or the second clock signal line, the first clock signal line and the third voltage signal line are arranged in sequence along the direction close to the display area.

Optionally, the at least one shift register unit further comprises an input transistor; a first electrode of the input transistor is coupled to the input signal end; a second electrode of the input transistor is coupled to a ninth conductive connection portion, and an orthographic projection of the ninth conductive connection portion on the substrate and an orthographic projection of the second electrode plate of the second capacitor on the substrate have a tenth overlapping area, and the ninth conductive connection portion is coupled to the second electrode plate of the second capacitor through a tenth via hole provided in the tenth overlapping area.

Optionally, the at least one shift register unit further comprises a third node control transistor, a second capacitor connection transistor, and an input transistor; a gate electrode the third node control transistor is coupled to the first clock signal line; an active layer of the input transistor, an active layer of the third node control transistor, and an active layer of the second capacitor connection transistor are formed by a continuous third semiconductor layer; the active layer of the input transistor includes a first one of fifth conductive portions, a fifth channel portion, and a second one of fifth conductive portions sequentially arranged along a first direction; the second one of fifth conductive portions is reused as a first one of sixth conductive portions; the active layer of the third node control transistor includes the first one of sixth conductive portions, a sixth channel portion, and a second one of sixth conductive portions sequentially arranged along the first direction; the second one of sixth conductive portions is reused as a first one of seventh conductive portion; the active layer of the second capacitor connection transistor includes the first one of seventh conductive portions, a seventh channel portion, and a second one of seventh conductive portions sequentially arranged along the first direction.

Optionally, the scan driving circuit further comprises a third voltage signal line; the at least one shift register unit further comprises an output transistor, an output reset transistor, an output capacitor, and a second capacitor, a first transistor, a second transistor, a first node control transistor, a second node control transistor, an input transistor, and a third node control transistor; the at least two transistors include a first capacitor connection transistor and a second capacitor connection transistor; a first electrode of the output reset transistor is coupled to the first voltage signal line, a first electrode of the output transistor is coupled to the second voltage signal line; a second electrode of the output transistor and a second electrode of the output reset transistor are all coupled to the signal output line; a second electrode of the first transistor is coupled to a second electrode plate of the output capacitor, a first electrode of the first transistor is coupled to the first voltage signal line, and a gate electrode the first transistor is coupled to a second electrode of the third node control transistor; a second electrode of the second transistor is coupled to a first electrode plate of the first capacitor, a first electrode of the second transistor is coupled to a second electrode of the first capacitor connection transistor, and a gate electrode of the second transistor is coupled to a gate electrode of the third node control transistor; a gate electrode the first capacitor connection transistor and a gate electrode of the second capacitor connection transistor are respectively coupled to a second electrode plate of the first capacitor; a second electrode of the first capacitor connection transistor is coupled to the first electrode plate of the first capacitor; a first electrode of the first capacitor connection transistor is coupled to the gate electrode of the second transistor; a first electrode of the second capacitor connection transistor is coupled to the first voltage signal line; the gate electrode the second capacitor connection transistor is coupled to a second electrode of the second node control transistor; a second electrode of the second capacitor connection transistor is coupled to a first electrode of the third node control transistor; a first electrode of the first node control transistor is coupled to a gate electrode the second node control transistor; a gate electrode of the first node control transistor is coupled to a second electrode plate of the second capacitor; the second electrode of the second node control transistor is coupled to a second electrode of the first node control transistor; the gate electrode of the second node control transistor is coupled to the second clock signal line; a first electrode of the second node control transistor is coupled to the third voltage signal line; a gate electrode of the input transistor is coupled to the gate electrode of the second node control transistor; a first electrode of the input transistor is coupled to the input signal end; a second electrode of the input transistor is coupled to the second electrode plate of the second capacitor; the gate electrode of the third node control transistor is coupled to the first clock signal line; a first electrode plate of the output capacitor is coupled to the first voltage signal line, and the second electrode plate of the output capacitor is coupled to a gate electrode of the output reset transistor; the second electrode plate of the second capacitor is coupled to a gate electrode of the output transistor, and a first electrode plate of the second capacitor is coupled to the first clock signal line.

Optionally, the first electrode plate of the first capacitor comprises a first horizontal plate portion and a first vertical plate portion; the output transistor and the output reset transistor are arranged between the first voltage signal line and the second voltage signal line; the output reset transistor, the output transistor and the signal output lines are arranged in sequence along the first direction; the third voltage signal line is arranged on a side of the first voltage signal line away from the second voltage signal line; the first capacitor, the first transistor, the second transistor, the first capacitor connection transistor, the second capacitor connection transistor, the first node control transistor, the second node control transistor, the input transistor and the third node control transistor are all arranged between the first voltage signal line and the third voltage signal line; the first transistor, the second transistor, and the first vertical plate portion are arranged in sequence along the first direction, the input transistor, the third node control transistor, the second capacitor connection transistor, and the first horizontal plate portion are arranged in sequence along the first direction, and the second node control transistor and the first node control transistor are arranged in sequence along the first direction; an orthographic projection of the gate electrode of the first capacitor connection transistor on the substrate is arranged between an orthographic projection of the second electrode plate of the first capacitor on the substrate and an orthographic projection of the first voltage signal line on the substrate; an orthographic projection of the gate electrode of the second transistor on the substrate is arranged between an orthographic projection of the gate electrode of the third node control transistor on the substrate and the orthographic projection of the first voltage signal line on the substrate; an orthographic projection of the gate electrode of the first node control transistor on the substrate is arranged between an orthographic projection of the third voltage signal line on the substrate and an orthographic projection of the first electrode plate of the first capacitor on the substrate; a minimum distance in the second direction between the orthographic projection of the gate electrode of the first node control transistor on the substrate and the orthographic projection of the third voltage signal line on the substrate is greater than a minimum distance in the second direction between the orthographic projection of the gate electrode of the second capacitor connection transistor on the substrate and the orthographic projection of the third voltage signal line on the substrate.

Optionally, an orthographic projection of the first electrode plate of the output capacitor on the substrate and an orthographic projection of the first voltage signal line on the substrate have a signal line overlapping area; an orthographic projection of the second electrode plate of the output capacitor on the substrate partially overlaps an orthographic projection of the first voltage signal line on the substrate; an orthographic projection of the first electrode plate of the second capacitor on the substrate is within an orthographic projection of the second electrode plate of the second capacitor on the substrate; the first electrode plate of the second capacitor is of an L shape; the first electrode plate of the second capacitor includes a second horizontal plate portion and a second vertical plate portion; the gate electrode of the first node control transistor and the second horizontal plate portion are arranged along a first direction; an orthographic projection of the second vertical plate portion on the substrate partially overlaps the orthographic projection of the third voltage signal line on the substrate.

Optionally, the display substrate further comprises a plurality of rows of pixel circuits arranged on the substrate; the pixel circuit comprises a light emitting control end; the plurality of shift register units included in the scan driving circuit correspond to the plurality of rows of pixel circuit in a one-to-one manner; the signal output line of the shift register unit is coupled to the light emitting control end of the corresponding row of pixel circuits, and is configured to provide a light emitting control signal to the light emitting control end of the corresponding row of pixel circuits.

In a second aspect, a method of manufacturing a display substrate includes forming a scan driving circuit on a substrate, and forming at least one driving transistor in a display area included in the display substrate; the driving transistor is configured to drive a light emitting element for display; the scan driving circuit includes a plurality of shift register units, a first voltage signal line, a second voltage signal line, a first clock signal line, and a second clock signal line, at least one shift register unit of the plurality of shift register units includes a signal output line, a first capacitor, and at least two transistors coupled to a same electrode plate of the first capacitor; gate electrodes of the at least two transistors are respectively coupled to the same electrode plate of the first capacitor; the method of manufacturing the display substrate further includes: forming the first capacitor and the at least two transistors on the same side of the first voltage signal line; arranging the first voltage signal line, the second voltage signal line, the first clock signal line, and the second clock signal line to extend along the first direction, and arranging the signal output line to extend along the second direction; wherein the first direction intersects the second direction.

Optionally, a maximum distance in the second direction between an orthographic projection of the gate electrodes of the at least two transistors on the substrate and an orthographic projection of the first voltage signal line on the substrate is less than a first predetermined distance.

Optionally, the first predetermined distance is greater than or equal to 30 microns and less than or equal to 40 microns.

Optionally, the at least two transistors include a first capacitor connection transistor and a second capacitor connection transistor; the forming the first capacitor connection transistor and the second capacitor connection transistor include: forming an active layer of the first capacitor connection transistor and an active layer of the second capacitor connection transistor on the substrate; forming a first gate metal layer on a side of the active layer away from the substrate, and performing a patterning process on the first gate metal layer to form a gate electrode of the first capacitor connection transistor, a gate electrode of the second capacitor connection transistor and a second electrode plate of the first capacitor, and the gate electrode of the first capacitor connection transistor and the gate electrode the second capacitor connection transistor are coupled to the second electrode plate of the first capacitor; doping a portion of the active layer that is not covered by the gate electrode of the first capacitor connection transistor and the gate electrode of the second capacitor connection transistor by using the gate electrode of the first capacitor connection transistor and the gate electrode of the second capacitor connection transistor as a mask, so that the portion of the active layer that is not covered by the gate electrode of the first capacitor connection transistor and the gate electrode of the second capacitor connection transistor is formed as a conductive portion, and another portion of the active layer that is covered by the gate electrodes is formed as a channel portion; the active layer of the first capacitor connection transistor includes a first one of first capacitor connection conductive portions, a first capacitor connection channel portion, and a second one of first capacitor connection conductive portions arranged in sequence along the first direction; the active layer of the second capacitor connection transistor includes a first one of seventh conductive portions, a seventh channel portion and a second one of seventh conductive portions arranged sequentially along the first direction; the first one of first capacitor connection conductive portions is used as a first electrode of the first capacitor connection transistor, the second one of first capacitor connection conductive portions is used as a second electrode of the first capacitor connection transistor; forming a second gate metal layer on a side of the first gate metal layer away from the active layer, and performing a patterning process on the second gate metal layer to form a first electrode plate of the first capacitor; forming a source-drain metal layer on a side of the second gate metal layer away from the first gate metal layer, and performing a patterning process on the source-drain metal layer to form the first voltage signal line, the second voltage signal line and the first conductive connection portion; wherein an orthographic projection of the first conductive connection portion on the substrate and an orthographic projection of the first electrode plate of the first capacitor on the substrate have a first overlapping area, and the first conductive connection portion is coupled to the first electrode plate of the first capacitor through at least one first via hole provided in the first overlapping area.

Optionally, the first one of seventh conductive portion is used as the second electrode of the second capacitor connection transistor, and the second one of seventh conductive portions is used as the first electrode of the second capacitor connection transistor, and the first electrode of the second capacitor connection transistor is coupled to the first voltage signal line; a maximum distance in the second direction between an orthographic projection of the gate electrode of the first capacitor connection transistor on the substrate and an orthographic projection of the first voltage signal line on the substrate is smaller than a maximum distance in the second direction between an orthographic projection of the gate electrode the second capacitor connection on the substrate and the orthographic projection of the first voltage signal line on the substrate.

Optionally, a maximum distance in the second direction between the gate electrode of the first capacitor connection transistor and the gate electrode of the second capacitor connection transistor is less than a second predetermined distance; an orthographic projection of the first electrode plate of the first capacitor on the substrate is arranged within an orthographic projection of the second electrode plate of the first capacitor on the substrate; the first electrode plate of the first capacitor is of an L shape.

Optionally, the at least one shift register unit may further include a first node control transistor and a second capacitor; the forming the first node control transistor and the second capacitor includes: forming an active layer of the first node control transistor on the substrate while forming the active layer of the first capacitor connection transistor and the active layer of the second capacitor connection transistor on the substrate; performing a patterning process on the first gate metal layer to form a gate electrode of the first node control transistor and the second electrode plate of the second capacitor, and the gate electrode of the first node control transistor being coupled to the second electrode plate of the second capacitor; doping a portion of the active layer of the first node control transistor that is not covered by the gate electrode of the first node control transistor using the gate electrode of the first node control transistor as a mask; patterning the second gate metal layer to form a first electrode plate of the second capacitor, and an orthographic projection of the first electrode plate of the second capacitor on the substrate being within an orthographic projection of the second electrode plate of the second capacitor on the substrate; the first electrode plate of the second capacitor being of an L shape; the first electrode plate of the second capacitor including a second horizontal plate portion; an orthographic projection of the gate electrode of the first node control transistor on the substrate an the orthographic projections of the second horizontal plate portion on the substrate being arranged along the first direction.

Optionally, the method further includes: performing a patterning process on the source-drain metal layer to form a third voltage signal line extending along the first direction; the first node control transistor is located on a side of the second capacitor connection transistor away from the first voltage signal line; the first node control transistor is located between the third voltage signal line and the first voltage signal line; the first electrode plate of the second capacitor further includes a second vertical plate portion coupled to the second horizontal plate portion; an orthographic projection of the second vertical plate portion on the substrate partially overlaps an orthographic projection of the third voltage signal line on the substrate.

In a third aspect, a display device includes the above display substrate.

DETAILED DESCRIPTION

The technical solutions in the embodiments of the present disclosure will be clearly and completely described below in conjunction with the accompanying drawings in the embodiments of the present disclosure. Obviously, the described embodiments are only a portion of the embodiments of the present disclosure, not all of the embodiments. Based on the embodiments in the present disclosure, all other embodiments obtained by those of ordinary skill in the art without creative work shall fall within the protection scope of the present disclosure.

Figure 1:
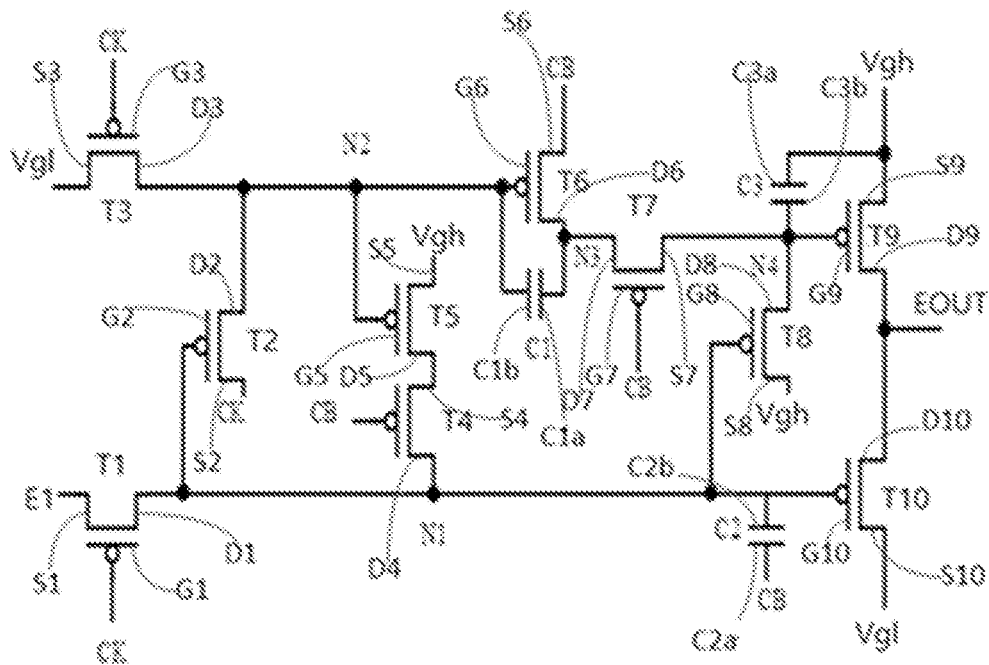
FIG. 1 is a circuit diagram of at least one shift register unit included in the display substrate according to at least one embodiment of the present disclosure.

As shown in FIG. 1, at least one embodiment of the present disclosure provides a display substrate. The display substrate includes a scan driving circuit located in an edge area of the display substrate. The scan driving circuit includes a first voltage signal line VGH, a second voltage signal line VGL1, a third voltage signal line VGL2, a first clock signal line CB, a second clock signal line CK, and a signal output line EOUT; the scan driving circuit includes a plurality of shift register units.

As shown in FIG. 1, at least one shift register unit of the plurality of shift register units includes an output reset transistor T9, an output transistor T10, an output capacitor C3, a first capacitor C1, a second capacitor C2, a first transistor T8, a second transistor T7, a first capacitor connection transistor T6, a second capacitor connection transistor T5, a first node control transistor T2, a second node control transistor T3, an input transistor T1 and a third node control transistor T4.

A gate electrode G9 of the output reset transistor T9 is coupled to a second electrode plate C3b of the output capacitor C3, and a first electrode S9 of the output reset transistor T9 is applied by a high voltage signal Vgh.

A gate electrode G10 of the output transistor T10 is coupled to a second electrode plate C2b of the second capacitor C2, and a first electrode S10 of the output transistor T10 is applied by a low voltage signal Vgl.

A second electrode D9 of the output reset transistor T9 and a second electrode D10 of the output transistor T10 are both coupled to the signal output line EOUT.

A second electrode D8 of the first transistor T8 is coupled to the second electrode plate C3b of the output capacitor C3, a first electrode S8 of the first transistor T8 is applied by the high voltage signal Vgh, and the gate electrode G8 of the first transistor T8 is coupled to the second electrode D4 of the third node control transistor T4.

A second electrode D7 of the second transistor T7 is coupled to the first electrode plate C1a of the first capacitor C1, and the first electrode S7 of the second transistor T7 is coupled to the second electrode plate C3b of the output capacitor C3, the gate electrode G7 of the second transistor T7 is coupled to the gate electrode G4 of the third node control transistor T4.

A gate electrode G6 of the first capacitor connection transistor T6 and the gate electrode G5 of the second capacitor connection transistor T5 are respectively coupled to the second electrode plate C1b of the first capacitor C; the second electrode D6 of the first capacitor connected to the transistor T6 is coupled to the first electrode plate C1a of the first capacitor C1; the first electrode S6 of the first capacitor connection transistor T6 is coupled to the gate electrode G7 of the second transistor T7.

A first electrode S5 of the second capacitor connection transistor T5 is coupled to the first voltage signal line VGH; the gate electrode G5 of the second capacitor connection transistor T5 is coupled to the second electrode D3 of the second node control transistor T3; the second electrode D5 of the second capacitor connection transistor T5 is coupled to the first electrode S4 of the third node control transistor T4.

A first electrode S2 of the first node control transistor T2 is coupled to the gate electrode G3 of the second node control transistor T3; the gate electrode G2 of the first node control transistor T2 is coupled to the second electrode plate C2b of the second capacitor C2.

A second electrode D3 of the second node control transistor T3 is coupled to the second electrode D2 of the first node control transistor T2; the gate electrode G3 of the second node control transistor T3 is coupled to the second clock signal line CK; the first electrode S3 of the second node control transistor T3 is applied by the low voltage signal Vgl.

A gate electrode G1 of the input transistor T1 is coupled to the gate electrode G3 of the second node control transistor T3; the first electrode S1 of the input transistor T1 is coupled to the input signal end E1; the first electrode S1 of the input transistor T1 is coupled to the input signal end E1; the second electrode D1 of the input transistor T1 is coupled to the second electrode plate C2b of the second capacitor C2.

A gate electrode G4 of the third node control transistor T4 is coupled to the first clock signal line CB.

A first electrode plate C3a of the output capacitor C3 is applied by the high voltage signal Vgh, and the second electrode plate C3b of the output capacitor C3 is coupled to the gate electrode G9 of the output reset transistor T9.

The second electrode plate C2b of the second capacitor C2 is coupled to the gate electrode G10 of the output transistor T10, and the first electrode plate C2a of the second capacitor C2 is coupled to the first clock signal line CB.

In the shift register unit shown in FIG. 1, all transistors are p-type transistors, but not limited to this.

In at least one embodiment of the present disclosure, the shift register unit shown in FIG. 1 may be a light emitting control scan driving circuit, but it is not limited thereto.

In at least one embodiment of the present disclosure, the first electrode of the transistor may be a source electrode, and the second electrode of the transistor may be a drain electrode; alternatively, the first electrode of the transistor may be a drain electrode, and the second electrode of the transistor may be a source electrode.

In FIG. 1, the node labeled N1 is a first node, the node labeled N2 is a second node, the node labeled N3 is a third node, and the node labeled N4 is a fourth node.

Figure 2A:
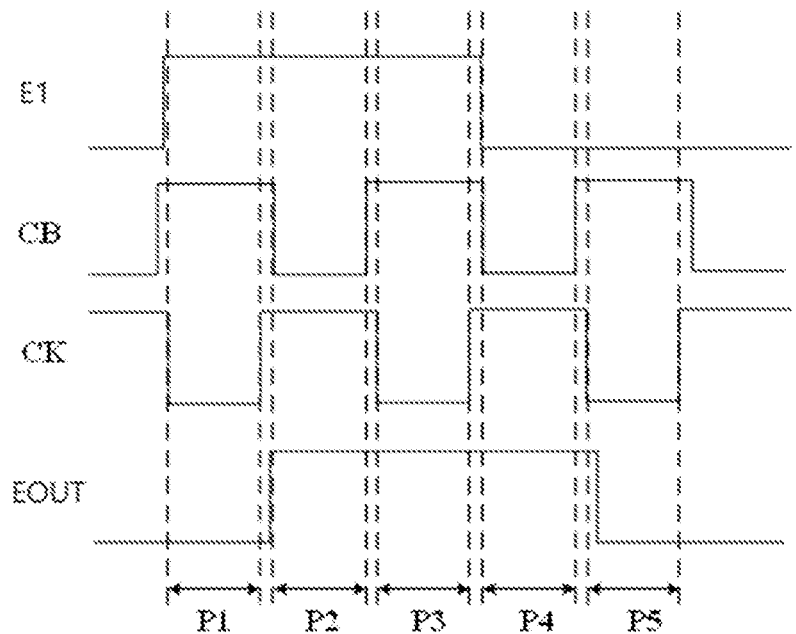
FIG. 2A is a working timing diagram of the shift register unit shown in FIG. 1 according to at least one embodiment of the present disclosure.

As shown in FIG. 2A, the shift register unit shown in FIG. 1 of the present disclosure is in operation as follows.

In the first phase P1, CK inputs a low level, T1 and T3 are turned on, and the high-level input signal provided by E1 is transmitted to the first node N1 by the T1 in the on state, so that the potential of the first node N1 becomes a high level to turn of T2, T8 and T10. In addition, Vgl is transmitted to the second node N2 by T3 in the on state, so that the level of the second node N2 becomes a low level, to turn on T5 and T6. Because CB inputs a high level, T7 is turned off; in addition, due to the energy storage effect of C3, the potential of the fourth node N4 can be maintained at a high level, so that T9 is turned off; in the first phase P1, because T9 and T10 are both turned off, EOUT keeps outputting a low level.

In the second phase P2, CB inputs a low level, T4 and T7 are turned on; because the first clock signal CK inputs a high level, T1 and T3 are turned off; due to the energy storage effect of the first capacitor C1, the potential of the second node N2 maintains at the low level as in the previous phase, T5 and T6 are turned on, and Vgh is transmitted to the first node N1 through T5 and T4 which are turned on, so that the potential of the first node N1 maintains at the high level in the previous phase, and T2, T8, and T10 are turned off; in addition, the low level provided by CB is transmitted to the fourth node N4 through T6 and T7 which are turned on, so that the potential of the fourth node N4 becomes a low level, T9 is turned on, EOUT outputs the high voltage signal Vgh.

In the third phase P3, CK inputs a low level, T1 and T3 are turned on; CB provides a high level, so T4 and T7 are turned off; due to the energy storage effect of C3, the potential of the fourth node N4 can maintain at the low level in the previous phase, so that T9 remains to be turned on and EOUT outputs the high voltage signal Vgh.

In the fourth phase P4, CK inputs a high level, T1 and T3 are turned off; CB inputs a low level, T4 and T7 are turned on; due to the energy storage effect of the second capacitor C2, the potential of the first node N1 remains at a high level in the previous phase, so that T2, T8 and T10 are turned off. Due to the energy storage effect of the first capacitor C1, the potential of the second node N2 maintains at the low level in the previous phase, so that T5 and T6 are turned on. In addition, the low voltage signal inputted by CB is transmitted to the fourth node N4 through T6 and T7 which are turned on, so that the level of the fourth node N4 becomes a low level, T9 is turned on, and the high voltage Vgh is outputted by T9 in the on state, EOUT outputs the high voltage signal Vgh.

In the fifth phase P5, CK inputs a low voltage signal, T1 and T3 are turned on; CB inputs a high voltage signal, and T4 and T7 are turned off. The low-level input signal provided by E1 is transmitted to the first node N1 by T1 in the on state, so that the potential of the first node N1 becomes a low level, so that T2, T8 and T10 are turned on; the second clock signal of the low level is transmitted to the second node N2 by T2 in the on state, so that the potential of the second node N2 can be further reduced, so the potential of the second node N2 maintains at the low level in the previous phase, so that T5 and T6 are turned on. In addition, Vgh is transmitted to the fourth node N4 by T8 in the on state, so that the potential of the fourth node N4 becomes a high voltage, T9 is turned off; Vgl is outputted by T10 in the on state, and EOUT outputs the low voltage signal Vgl.

Figure 2B:
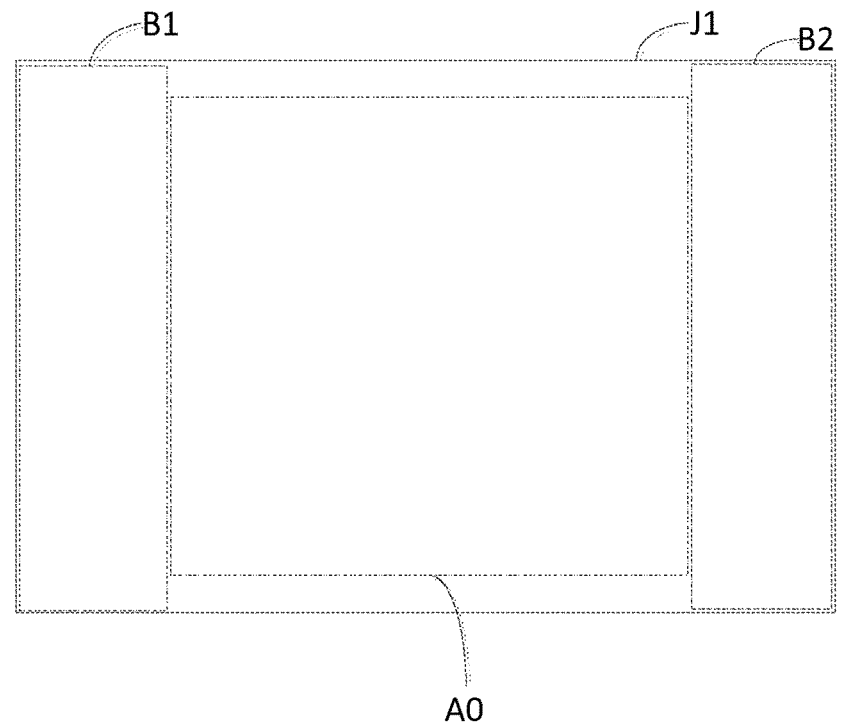
FIG. 2B is a schematic diagram of the area division of the display substrate according to at least one embodiment of the present disclosure.

As shown in FIG. 2B, the label J1 represents the display substrate, the label A0 represents the display area, the label B1 represents the first edge area, and the label B2 represents the second edge area.

The display area A0 of the display substrate J1 may be provided with a plurality of light emitting control lines, a plurality of gate lines, and a plurality of data lines, and a plurality of sub-pixels defined by the plurality of gate lines and the plurality of data lines.

A scan driving circuit may be provided in the first edge area B1 and/or the second edge area B2, and the scan driving circuit includes a plurality of shift register units.

The plurality of shift register units included in the scan driving circuit correspond to the plurality of light emitting control lines in the one-to-one manner, and the signal output line of each shift register unit is coupled to the corresponding light emitting control line to provide a light emitting control signal or a corresponding light emitting control line.

In specific implementation, one light emitting control line is coupled to the light emitting control end of the pixel circuits in a corresponding row.

Optionally, the display substrate further includes a plurality of rows of pixel circuits arranged on the base; the pixel circuit includes a light emitting control end. The shift register unit included in the scan driving circuit corresponds to the row of pixel circuits in the one-to-one manner.

The signal output line of the shift register unit is coupled to the light emitting control end of the corresponding row of pixel circuits, and is used to provide a light emitting control signal for the light emitting control end of the corresponding row of pixel circuits.

In at least one embodiment of the present disclosure, the pixel circuit may be disposed in an effective display area of the display substrate, and the scan driving circuit may be disposed in the edge area of the display substrate.

Figure 2C:
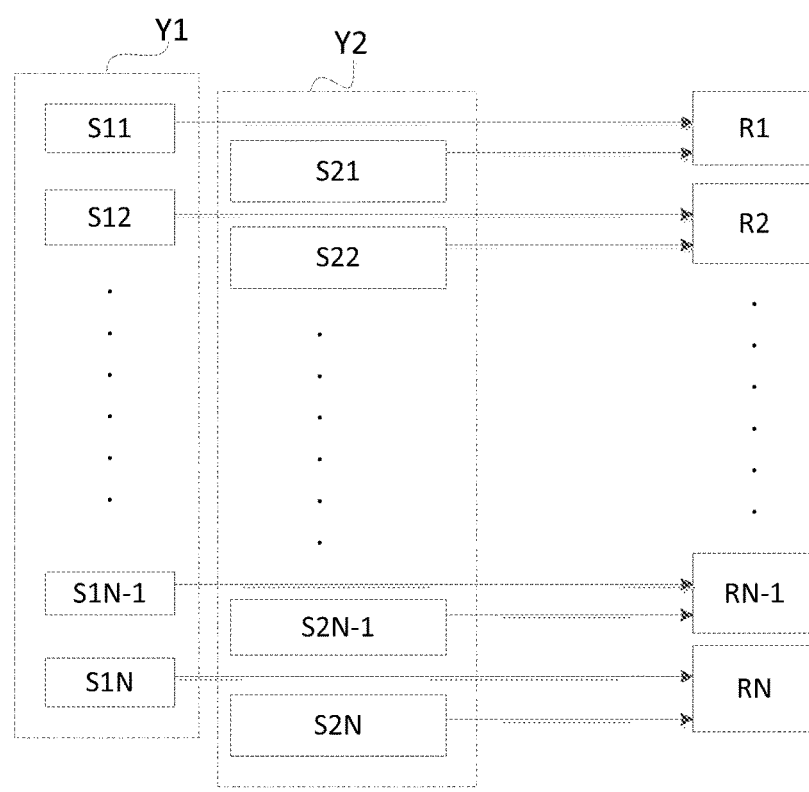
FIG. 2C is a schematic diagram of a connection relationship between the scan driving circuit and the pixel circuit included in the display substrate according to at least one embodiment of the present disclosure.

As shown in FIG. 2C, Y1 represents a scan driving circuit, S11 represents the first stage of shift register unit included in the scan driving circuit S1, and S12 is the second stage of shift register unit included in the scan driving circuit S1. S1N−1 is the (N−1)th stage of shift register unit included in the scan driving circuit S1, and S1N is the Nth stage of shift register unit included in the scan driving circuit S1, N is an integer greater than 3.

In FIG. 2C, R1 represents the pixel circuits in the first row, R2 represents the pixel circuits in the second row, RN−1 represents the pixel circuits in the (N−1)th row, and RN represents the pixel circuits in the Nth row.

S11 corresponds to R1, S12 corresponds to R2, S1N−1 corresponds to RN−1, and S1N corresponds to RN. S11 provides R1 with the lighting control signal in the first row, S12 provides R2 with the lighting control signal in the second row, S1N−1 provides R1N−1 with the lighting control signal in the (N−1)th row, and S1N provides R1N with the lighting control signal in the Nth row.

As shown in FIG. 2C, in the edge area, the display substrate may further include a gate driving circuit, the gate driving circuit includes a plurality of stages of gate driving unit, and the gate driving units and the rows of pixels are also in one-to-one correspondence, the gate driving unit is used to provide a gate driving signal for a corresponding row of pixels.

In FIG. 2C, Y2 represents the gate driving circuit, S21 represents the first row of gate driving units included in the gate driving circuit, and S22 represents the second row of gate driving units included in the gate driving circuit, S2N−1 represents the (N−1)th row of gate driving units included in the gate driving circuit, and S2N is the Nth row of gate driving units included in the gate driving circuit.

Figure 2D:
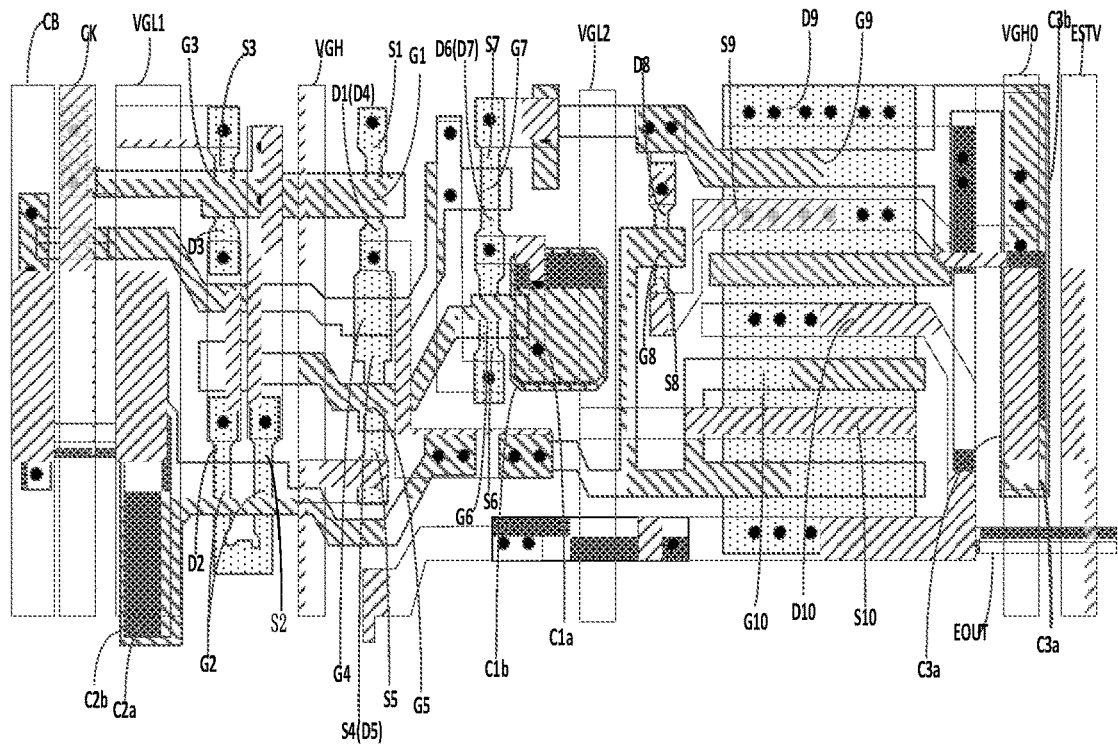
FIG. 2D is a schematic diagram of a layout of a shift register unit according to at least one embodiment of the present disclosure.

As shown in FIG. 2D, the first voltage signal line VGH provides a high voltage signal Vgh, the second voltage signal line VGL1 and the third voltage signal line VGL2 provide a low voltage signal Vgl, and the fourth voltage signal line VGH0 provides a high voltage signal Vgh.

As shown in FIG. 2D, ESTV, VGH0, VGL2, VGH, VGL1, CK and CB are arranged along a direction away from the display area; ESTV, VGH0, VGL2, VGH, VGL1, CK and CB extend in the first direction. T8, T9 and T10 are arranged between VGL2 and VGH0, T9 and T10 are arranged along the first direction; T8 is arranged between T9 and VGL2; T6, T7, C1, T1, T4 and T5 are set between VGH and VGL2; C1 is set between VGL2 and T6; T4 is set between VGL2 and T6; T7 and T6 are arranged in sequence along the first direction, and T1, T4 and T5 are arranged in sequence along the first direction; T2 and T3 are arranged between VGL1 and VGH, and T3 and T2 are arranged in sequence along the first direction.

The orthographic projection of C3 on the substrate partially overlaps the orthographic projection of VGH0 on the substrate, and the orthographic projection of C2 on the substrate partially overlaps the orthographic projection of VGL1 on the substrate.

In FIG. 2D, the start signal line is marked with ESTV.

As shown in FIG. 2D, D1 is reused as D4, S4 is reused as D5, and D6 is reused as D7.

Figure 3:
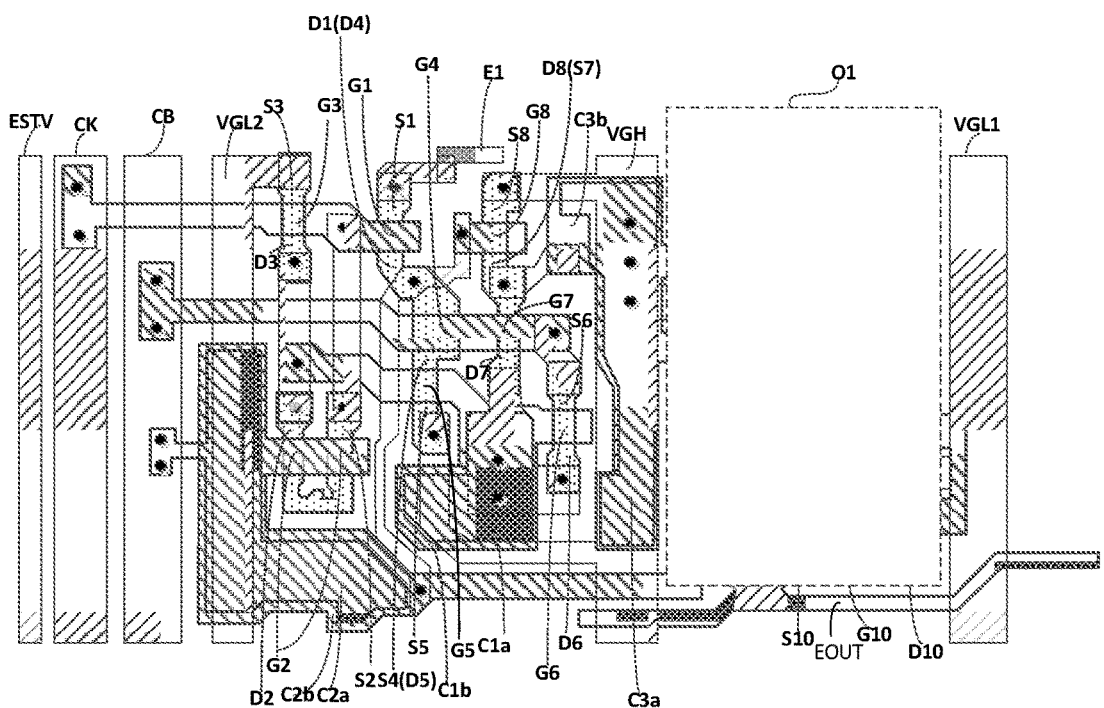
FIG. 3 is a schematic diagram of another layout of the shift register unit according to at least one embodiment of the present disclosure.

In FIGS. 2D and 3, G1 is the gate electrode T1, S1 is the first electrode of T1, D1 is the second electrode of T1; G2 is the gate electrode of T2, S2 is the first electrode of T2, D2 is the second electrode of T2; G3 is the gate electrode T3, S3 is the first electrode of T3, and D3 is the second electrode of T3, G4 is the gate electrode of T4, S4 is the first electrode of T4, and T4 is the second electrode of D4; G5 is the gate electrode of T5, and S5 is the first electrode of T5, D5 is the second electrode of T5; G6 is the gate electrode of T6, S6 is the first electrode of T6, and D6 is the second electrode of T6; G7 is the gate electrode of T7, S7 is the first electrode of T7, and D7 is the second electrode of T7; G8 is the gate electrode of T8, and S8 is the first electrode of T8; D8 is the second electrode of T8; G9 is the gate electrode of T9, S9 is the first electrode of T9, D9 is the second electrode of T9; G10 is the gate electrode of T10, S10 is the first electrode of T10, and D10 is the second electrode of T10.

In FIG. 2D, the start signal line is marked with ESTV.

In the above-mentioned layout of the gate driving circuit shown in FIG. 2D, due to the use of two signal lines that provide high voltage signals, the signal line connection is messy, and a space between T10 in the nth stage of shift register unit and the output reset transistors in the (n+1)th stage of shift register unit are not fully utilized to set EOUT, and C1 does not fully use the space between the gate electrode of T5 and the second conductive connection, and C2 does not fully use the space between T2 and the adjacent next stage of shift register unit, so that the lateral width of the shift register unit is large, which is not conducive to the narrow frame development of the display substrate.

The shift register unit shown in FIG. 2D may be the nth stage of shift register unit included in the scan driving circuit, and n is a positive integer.

Based on the above problems, the layout of the transistors in the shift register unit can be adjusted to reduce area occupied by the shift register units, thereby reducing the frame width of the display substrate.

In the layout shown in FIG. 3, the first voltage signal line VGH provides a high voltage signal Vgh, and the second voltage signal line VGL1 and the third voltage signal line VGL2 provide a low voltage signal Vgl; in at least one embodiment of the present disclosure, a signal line for providing the high voltage signal Vgh is omitted, and VGH is set between VGL1 and VGL2 to facilitate layout.

Compared with FIG. 2D, the embodiment shown in FIG. 3 removes the fourth voltage signal line VGH0, only the first voltage signal line VGH, the second voltage signal line VGL1, and the third voltage signal line VGL2 are used, and VGH is set between VGL1 and VGL2.

As shown in FIG. 3, the first electrode S9 of the output reset transistor T9 is coupled to the first voltage signal line VGH, the first electrode S10 of the output transistor T10 is coupled to the second voltage signal line VGL1, and the first electrode S8 of a first transistor T8 is coupled to the first voltage signal line VGH, the first electrode S5 of the second capacitor connection transistor T5 is coupled to the first voltage signal line VGH, and the first electrode S3 of the second node control transistor T3 is coupled to the third voltage signal line VGL2, and the first electrode plate C3a of the output capacitor C3 is coupled to the first voltage signal line VGH.

As shown in FIG. 3, when the shift register unit of the above structure is arranged in the edge area of the display substrate, the second voltage signal line VGL1, the first voltage signal line VGH, and the third voltage signal lines VGL2 are arranged in sequence along the direction away from the display area of the display substrate; the second voltage signal line VGL1, the first voltage signal line VGH and the third voltage signal line VGL2 all extend along the first direction.

Moreover, a first clock signal line CB, a second clock signal line CK, and an start voltage signal line ESTV are provided at a side of the third voltage signal line VGL2 away from the first voltage signal line VGH. The first clock signal line CB, the second clock signal line CK and the start voltage signal line ESTV are arranged in sequence along the second direction away from the display area; the first clock signal line CB, the second clock signal line CK and the start voltage signal lines ESTV all extend along the first direction.

The output reset transistor T9 and the reset transistor T10 are arranged between the first voltage signal line VGH and the second voltage signal line VGL1; the output reset transistor T9, the output The transistor T10 and the signal output line EOUT are arranged in sequence along the first direction.

The first capacitor C1, the first transistor T8, the second transistor T7, the first capacitor connection transistor T6, the second capacitor connection transistor T5, the first node control transistor T2, the second node control transistor T3, the input transistor T1 and the third node control transistor T4 are all arranged between the first voltage signal line VGH and the third voltage signal line VGL2.

The first transistor T8, the second transistor T7, and the first capacitor C1 are sequentially arranged along a first direction, the input transistor T1, the third node control transistor T4, and the second capacitor connection transistor T5 and the first capacitor C1 are sequentially arranged along the first direction, and the second node control transistor T3 and the first node control transistor T2 are sequentially arranged along the first direction.

The second transistor T7 and the third node control transistor T4 are sequentially arranged along the second direction. The first capacitor connection transistor T6 and the second capacitor connection transistor T5 are sequentially arranged along the second direction. The first transistor T8, the input transistor T1, and the second node control transistor T3 are arranged along a second direction. Moreover, the active pattern of the first node control transistor T2 is arranged in a U-shaped structure, so that T2 is formed as a double gate structure.

In at least one embodiment of the present disclosure, the input signal end of the first stage of shift register unit included in the scan driving circuit is coupled to the start signal line ESTV, and the input signal end is coupled to the first electrode S1 of the input transistor T1.

In at least one embodiment of the present disclosure, the first direction intersects the second direction, for example, the first direction may be perpendicular to the second direction, but it is not limited thereto.

Specifically, the angle at which the second direction intersects with the first direction can be set according to actual needs. For example, the second direction is perpendicular to the first direction.

In at least one embodiment of the present disclosure, the position of the first clock signal line CB and the position of the second clock signal line CK can be interchanged, but this is limited.

For example, in the layout shown in FIG. 3, the first direction may be a vertical direction from top to bottom, and the second direction may be a horizontal direction from right to left, but it is not limited to this.

In actual operation, the width of a signal line mainly affects resistance, and the wider signal line has less resistance, which is beneficial to signal stability. Among them, the first voltage signal line VGH, the second voltage signal line VGL1, and the third voltage signal line VGL2 provide a direct current voltage, which is less affected by the line width. The first clock signal line CB and the second clock signal line CK provide clock signals. When the potential of the clock signal is converted from a high voltage to a low voltage, the clock signal line having a smaller resistance reaches the low voltage faster. Therefore, in at least one embodiment of the present disclosure, the line width of the first clock signal line CB and the line width of the second clock signal line are set to be wider.

As shown in FIG. 3, the orthographic projection of the first electrode plate C3a of the output capacitor C3 on the substrate and the orthographic projection of the first voltage signal line VGH on the substrate has a signal line overlapping area, the orthographic projection of the second electrode plate C3b of the output capacitor C3 on the substrate partially overlaps the orthographic projection of the first voltage signal line VGH on the substrate.

The orthographic projection of the first electrode plate C2a of the second capacitor C2 on the substrate is within the orthographic projection of the second electrode plate C2b of the second capacitor C2 on the substrate; the first electrode plate C2a of the second capacitor C2 is of an L shape.

It can be seen from FIG. 3 that the lateral portion of the first electrode plate of C2 is arranged between T2 in the nth stage of shift register unit and the second node control transistor in the (n+1)th stage of shift register unit. A space between T2 in the nth stage of shift register unit and the second node control transistor in the (n+1)th stage of shift register unit is fully utilized, and the lateral portion of the first electrode plate of C1 is located at the gate electrode of T5 and the second conductive connection portion L2, the space between the gate electrode of T5 and the second conductive connection portion L2 is fully utilized.

In the layout shown in FIG. 3 of the present disclosure, since the output reset transistor T9 is coupled to the first voltage signal line VGH, and the output transistor T10 is coupled to the second voltage signal line VGL1, the output reset transistor T9 and the output transistor T10 are set between the first voltage signal line VGH and the second voltage signal line VGL1, and make full use of the space between the T10 included in the nth stage of shift register unit and the output reset transistor included in the (n+1)th stage of shift register unit to set the signal output line EOUT, so that T9 and T10 are set between VGH and VGL1, and no other signal lines or members included in other transistors are set between the first voltage signal line VGH and the output circuit (the output circuit includes T9 and T10), no other signal lines or members included in other transistors are set between the second voltage signal line VGL1 and the output circuit (the output circuit includes T9 and T10), thereby reducing the distance between VGH to T9 and T10, reducing the distance between VGL1 to T9 and T10, reducing the lateral width of the shift register unit.

In at least one embodiment of the present disclosure, the shift register unit shown in FIG. 3 may be an nth stage of shift register unit included in the scan driving circuit, and n is a positive integer.

Moreover, in the layout shown in FIG. 3 of the present disclosure, since the first electrode S8 of T8 is coupled to the first voltage signal line VGH, the second electrode D8 of T8 is coupled to the second electrode plate C3b of the output capacitor C3, the distance between T8 to VGH and C3 is smaller, the corresponding layout will be more reasonable. In at least one embodiment of the present disclosure, T8 is arranged on the side of the first voltage signal line VGH away from the second voltage signal line VGL1, and T8 is arranged close to the adjacent previous stage of shift register unit, so as to utilize the space between T8 in the nth stage of shift register unit and the first transistor included in the (n+1)th stage of shift register unit, and reduce the length of the signal line between the source electrode of T8 and VGH, and reduce the length the signal line between the drain electrode of T8 and C3, reduce the lateral width of the shift register unit. As shown in FIG. 3, T7, T6 and C1 are all set in the space between T8 in the nth stage of shift register unit and the first transistor included in the (n+1)th stage of shift register unit, so as to fully use the space between T8 in the nth stage of shift register unit and the first transistor included in the (n+1)th stage of shift register unit.

Further, the gate electrode G5 of T5 is coupled to the second electrode plate C1b of C1, and the second electrode D6 of T6 is coupled to the first electrode plate C1a of the first capacitor C1, then the position of T5 and the position of T6 should be close to VGH and the distance between T5 and T6 is reduced to adjust the shape of C1. As shown in FIG. 3, at least one embodiment of the present disclosure sets the electrode plate of the first capacitor C1 to be the L shape.

And as shown in FIG. 3, C2 makes full use of the extra space between T2 in the nth stage of shift register unit and the second node control transistor in the (n+1)th stage of shift register unit, the electrode plates of the second capacitor C2 is set to be an L shape. Through the above setting, the lateral width of the shift register unit can be shortened to a certain extent, and the vertical height can be optimized.

The display substrate according to at least one embodiment of the present disclosure includes a scan driving circuit and a display area disposed on the substrate, the scan driving circuit includes a plurality of shift register units; the scan driving circuit further includes a first voltage signal line, second voltage signal line, first clock signal line, and second clock signal line. The first voltage signal line, the second voltage signal line, the first clock signal line, and the second clock signal line extends along the first direction; the display area includes at least one driving transistor configured to drive the light emitting element for display.

At least one shift register unit of the plurality of shift register units includes a signal output line, a first capacitor, and at least two transistors coupled to the same electrode plate of the first capacitor; the signal output line extends along a second direction, the first direction intersecting the second direction.

The gate electrodes of the at least two transistors are respectively coupled to the same electrode plate of the first capacitor, and both the first capacitor and the at least two transistors are arranged on the same side of the first voltage signal line.

In at least one embodiment of the present disclosure, the electrode plate of the first capacitor coupled to the at least two transistors may be the second electrode plate of the first capacitor.

In at least one embodiment of the present disclosure, since the transistor coupled to the second electrode plate of the first capacitor is also coupled to the first voltage signal line, the first capacitor and the at least two transistors are all arranged on the same side of the first voltage signal line for a reasonable layout.

In specific implementation, a maximum distance in the second direction between the orthographic projection of the gate electrodes of the at least two transistors on the substrate and the orthographic projection of the first voltage signal line on the substrate may be less than the first predetermined distance.

In specific implementation, since the transistor coupled to the second electrode plate of the first capacitor is also coupled to the first voltage signal line, the position of the transistor coupled to the second electrode plate of the first capacitor is better to be close to the first voltage signal line. In at least one embodiment of the present disclosure, the maximum distance in the second direction between the orthographic projection of a gate electrode a transistor coupled to an electrode plate of the first capacitor on the substrate and the orthographic projection of the first voltage signal line on the substrate is set to be smaller than the first predetermined distance, so as to reduce the lateral width of the shift register unit.

In at least one embodiment of the present disclosure, the first predetermined distance may be selected according to actual conditions, for example, the first predetermined distance may be selected according to actual conditions, for example, the first predetermined distance is greater than or equal to 30 um (micrometers) and less than or equal to 40 um.

In at least one embodiment of the present disclosure, the first voltage signal line may extend along a first direction.

In at least one embodiment of the present disclosure, the maximum distance in the second direction between the orthographic projection of the gate electrode the transistor coupled to an electrode plate of the first capacitor on the substrate and the orthographic projection of the first voltage signal line on the substrate refers to the maximum distance in the second direction between any point of the edge line of the orthographic projection of the gate electrode of the transistor coupled to the electrode plate of the first capacitor on the substrate and the orthographic projection of the first voltage signal line on the substrate.

In specific implementation, the first capacitor and the at least two transistors are all arranged on a side of the first voltage signal line away from the second voltage signal line.

In at least one embodiment of the present disclosure, the second voltage signal line may extend along the first direction.

In at least one embodiment of the present disclosure, the first voltage signal line may be located on a side of the second voltage signal line away from the display area.

As shown in FIG. 3, the display substrate according to at least one embodiment of the present disclosure includes a substrate, and a scan driving circuit disposed on the substrate, the scan driving circuit includes a plurality of shift register units; the scan driving circuit also includes a first voltage signal line VGH and a second voltage signal line VGL1.

The at least two transistors are coupled to the second electrode plate C1b of the first capacitor C1.

As shown in FIGS. 1 and 3, the transistor coupled to the second electrode plate C1b of the first capacitor C1 may include a first capacitor connection transistor T6 and a second capacitor connection transistor T5.

Figure 5:
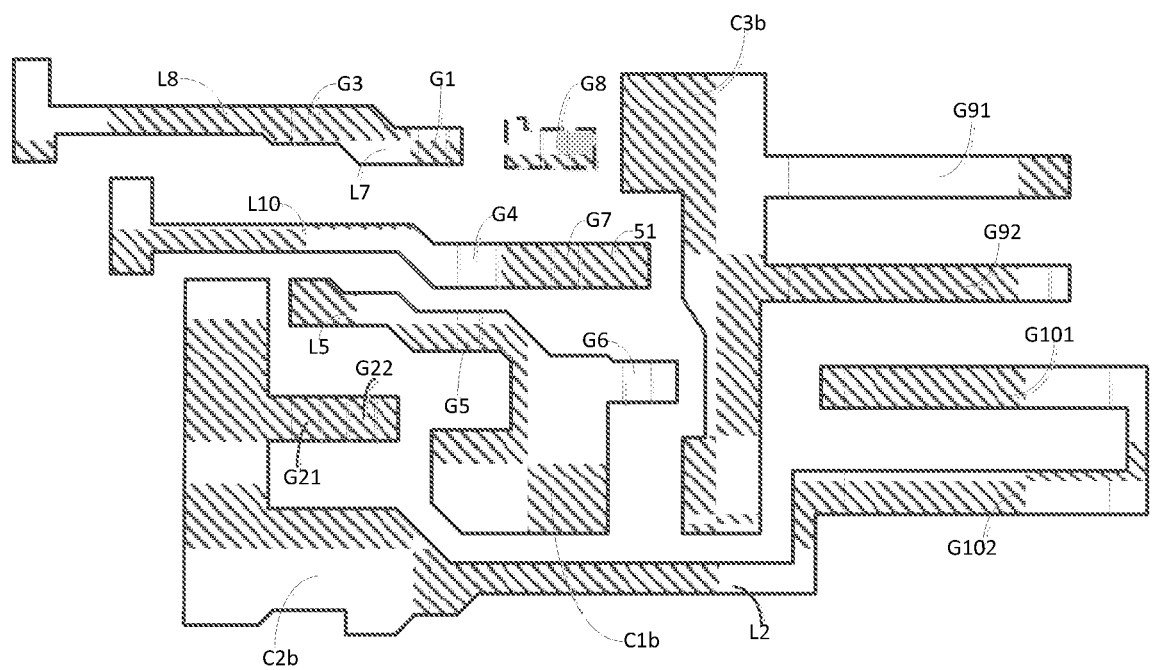
FIG. 5 is a schematic diagram of a first gate metal layer in the shift register unit according to at least one embodiment of the present disclosure.

As shown in FIGS. 3 and 5, the gate electrode G6 of the first capacitor connection transistor T6 and the gate electrode G5 of the second capacitor connection transistor T5 are respectively coupled to the second electrode plate C1b of the first capacitor C1.

Figure 7:
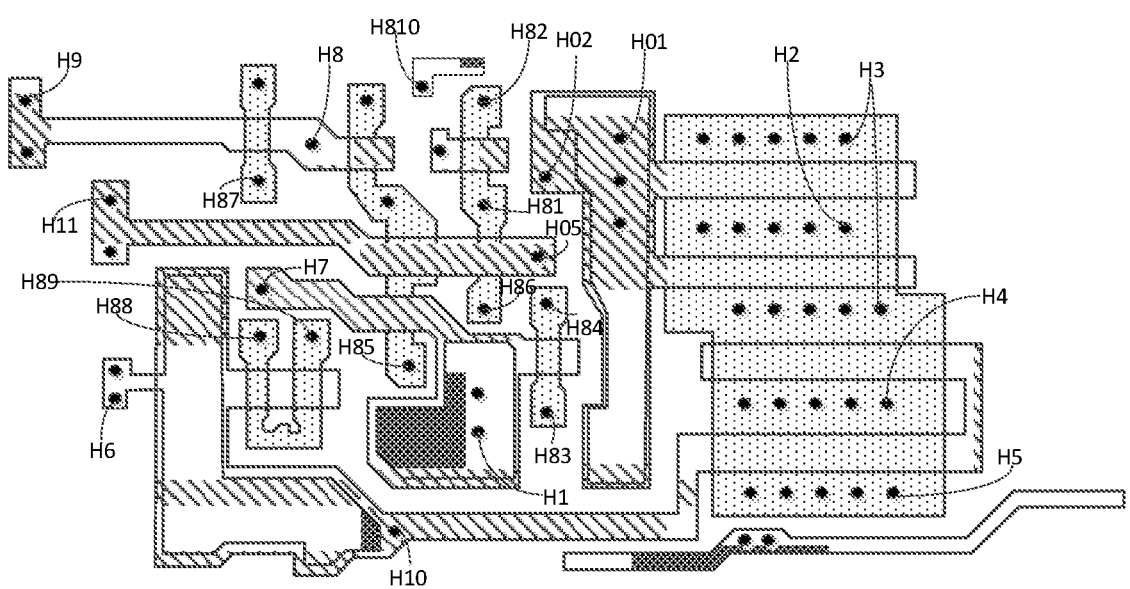
FIG. 7 is a schematic diagram of a via hole used in a shift register unit according to at least one embodiment of the present disclosure.
Figure 8:
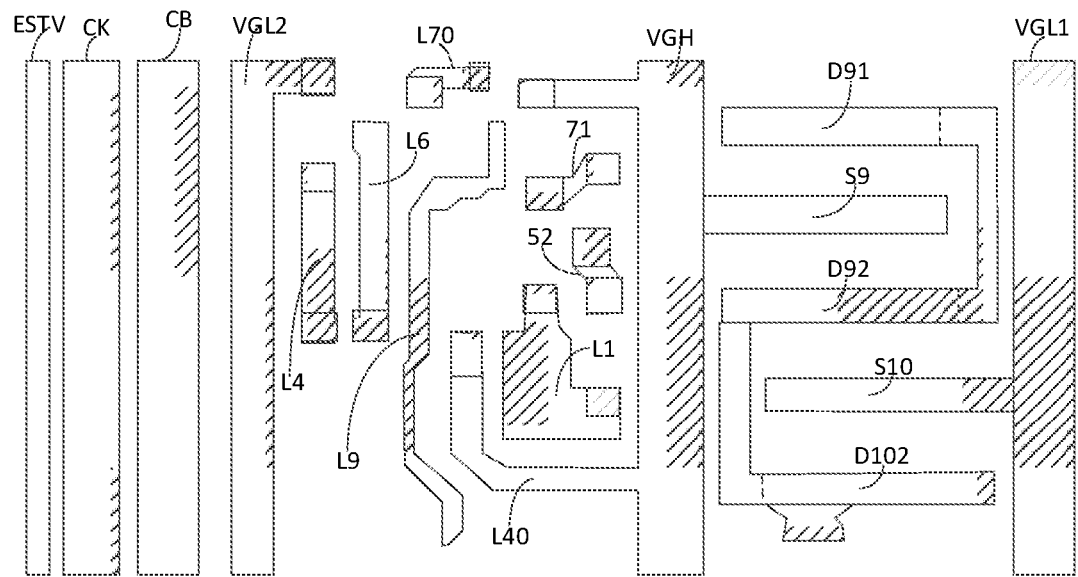
FIG. 8 is a schematic diagram of a source-drain metal layer in the shift register unit according to at least one embodiment of the present disclosure.

As shown in FIGS. 3, 7 and 8, the at least one shift register unit further includes a first conductive connection portion L1 coupled to the second electrode S6 of the first capacitor connection transistor T6, and the orthographic projection of the first conductive connection portion L1 on the substrate and the orthographic projection of the first electrode plate C1a of the first capacitor C1 on the substrate have a first overlapping area, and the first conductive connection portion L1 is coupled to the first electrode plate C1a of the first capacitor C1 through at least one first via hole H1 provided in the first overlapping area.

In at least one embodiment of the present disclosure, the second electrode S6 of the first capacitor connection transistor T6 is coupled to the first conductive connection portion L1 through a third connection via hole H83.

Optionally, the first conductive connection portion L1 may be of an L shape, but not limited to this.

Figure 10A:
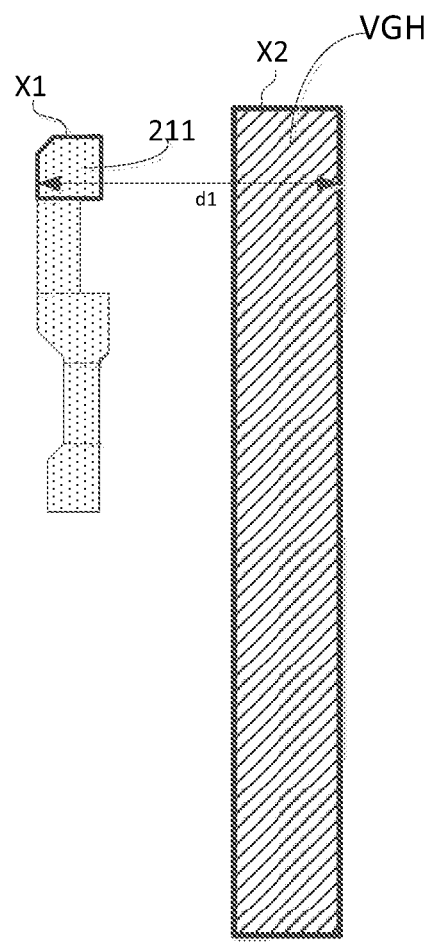
FIG. 10A is a schematic diagram showing a distance between an orthographic projection of a first voltage signal line VGH on the substrate and an orthographic projection of the first one of third conductive portions 211 included in in the second semiconductor layer and used as the first electrode S8 of the first transistor T8 on the substrate.
Figure 10B:
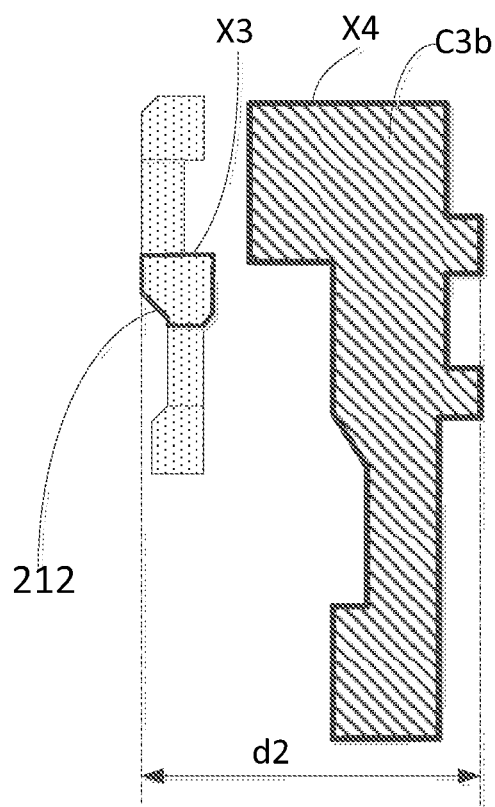
FIG. 10B is a schematic diagram showing a distance between the orthographic projection of the first voltage signal line VGH on the substrate and the orthographic projection of the second one of third conductive portions 212 included in the second semiconductor layer and used as the second electrode D8 of the first transistor T8.
Figure 10C:
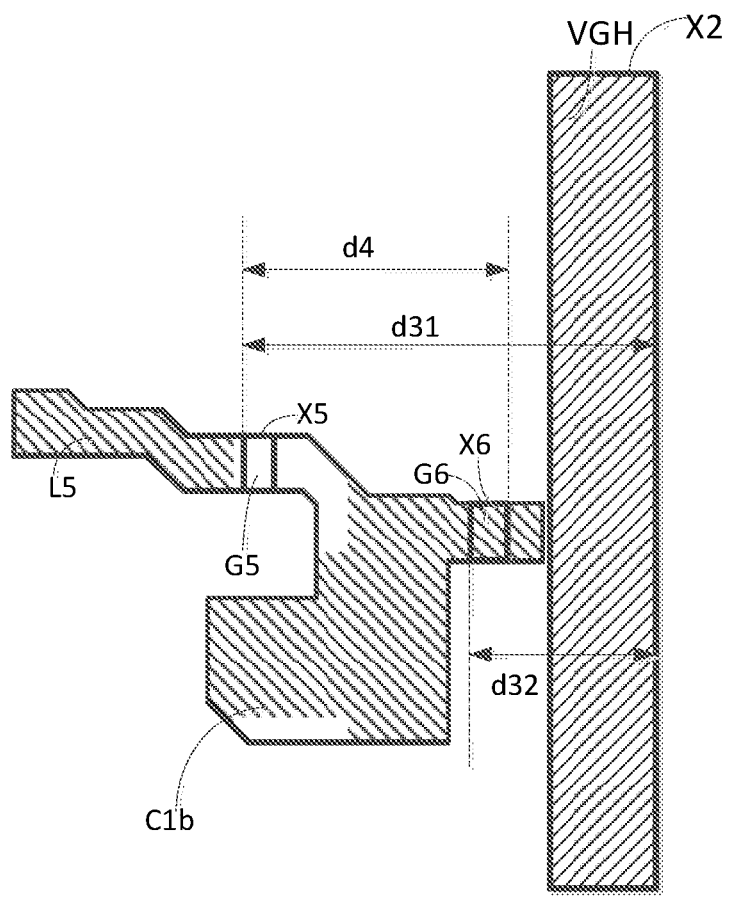
FIG. 10C is a schematic diagram of distances among the orthographic projection of the gate electrode G5 of T5 on the substrate, the orthographic projection of the gate electrode G6 of T6 on the substrate, and the orthographic projection of the first voltage signal line VGH on the substrate.

In FIG. 10C, only the orthographic projections of the gate electrode G5 of T5, the gate electrode G6 of T6, the second electrode plate C1b of C1, and the fifth conductive connection portion L5 on the substrate are shown, and the orthographic projection of the first voltage signal line VGH on the substrate.

In FIG. 10C, X2 is the edge line of the orthographic projection of the first voltage signal line VGH on the substrate, X5 is the edge line of the orthographic projection of G5 on the substrate, and X6 is the edge line of the orthographic projection of G5 on the substrate.

As shown in FIG. 10C, the label d3 is the maximum distance in the second direction between the orthographic projection of the gate electrode G5 of T5 on the substrate and the orthographic projection of the VGH on the substrate.

The label d4 is the maximum distance in the second direction between the orthographic projection of the gate electrode G6 of T6 on the substrate and the orthographic projection of the VGH on the substrate.

In at least one embodiment of the present disclosure, as shown in FIGS. 1 and 3, the at least one shift register unit may further include a second transistor T7;

As shown in FIGS. 3, 5, 7 and 8, the at least one shift register unit further includes a gate connection conductive portion 51 coupled with the gate electrode G7 of the second transistor T7, and a first electrode connecting conductive portion 52 coupled to the first electrode S6 of the first capacitor connection transistor T6.

There is a connection overlapping area between the gate connecting conductive portion 51 and the first electrode connecting conductive portion 52.

The gate connection conductive portion 51 is coupled to the first electrode connection conductive portion 52 through the electrode connection via hole H05 provided in the connection overlapping area, so that the gate electrode G7 of the second transistor T7 is connected to the first electrode S6 of the first capacitor connection transistor T6.

In at least one embodiment of the present disclosure, the first electrode S6 of the first capacitor connection transistor T6 is coupled to the first electrode connection conductive portion 52 through a fourth connection via hole H84.

Specifically, as shown in FIG. 3, the first electrode S5 of the second capacitor connection transistor T5 may be coupled to the first voltage signal line VGH.

As shown in FIGS. 3 and 10C, the maximum distance d32 in the second direction between the orthographic projection of the gate electrode G6 of the first capacitor connection transistor T6 on the substrate and the orthographic projection of the first voltage signal line VGH on the substrate is smaller than the maximum distance d31 in the second direction between the orthographic projection of the gate electrode the second capacitor connection transistor T5 on the substrate and the orthographic projection of the first voltage signal line VGH on the substrate. That is, T5 is arranged on the side of T6 away from the first voltage signal line VGH.

In at least one embodiment of the present disclosure, as shown in FIG. 3, FIG. 4, FIG. 7 and FIG. 8, the first electrode S5 of the second capacitor connection transistor T5 is connected to the signal line conductive connection portion through the fifth connection via hole H85. The signal line conductive connection portion L40 is coupled to the first voltage signal line VGH, so that the first electrode S5 of the second capacitor connection transistor T5 is coupled to the first voltage signal line VGH.

Optionally, the signal line conductive connection portion L40 may be of an L shape.

As shown in FIG. 5, the maximum distance in the second direction between the gate electrode G6 of the first capacitor connection transistor T6 and the gate electrode G5 of the second capacitor connection transistor T5 is less than the second predetermined distance.

As shown in FIG. 3, the orthographic projection of the first electrode plate C1a of the first capacitor C1 on the substrate is within the orthographic projection of the second electrode plate C1b of the first capacitor C1 on the substrate.

Figure 6:
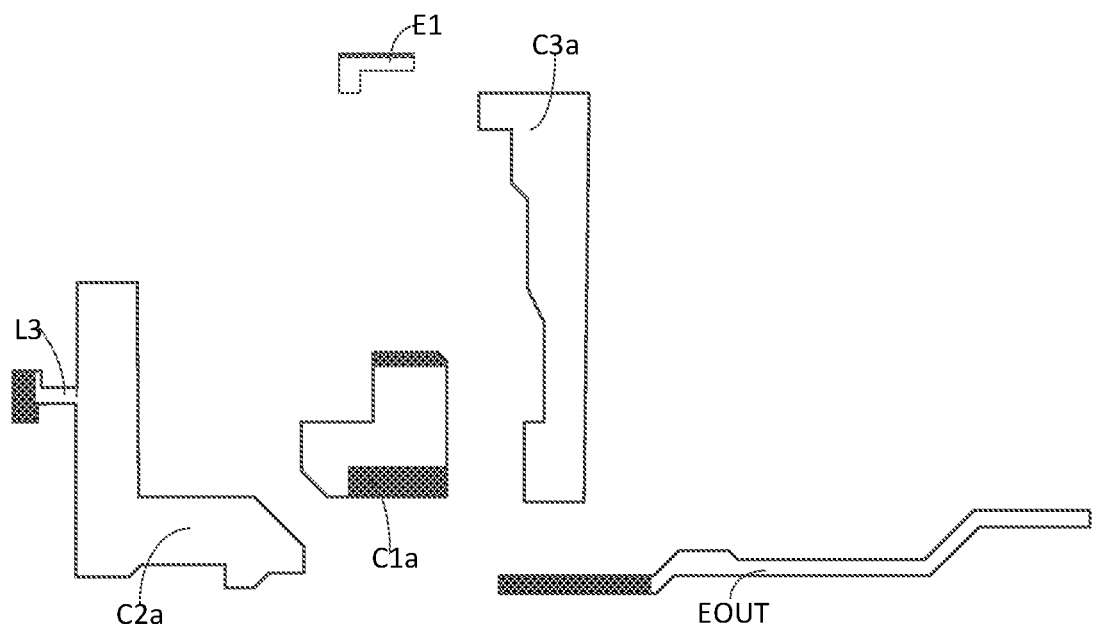
FIG. 6 is a schematic diagram of a second gate metal layer in the shift register unit according to at least one embodiment of the present disclosure.

As shown in FIG. 6, the first electrode plate C1a of the first capacitor C1 is of an L shape.

In at least one embodiment of the present disclosure, T5 and T6 are set to be relatively close to each other to adjust the shape of the electrode plate of C1, and the first electrode plate C1a of C1 is set to be an L shape, which makes full use of the wiring space below T5 and T6. The wiring space makes the layout more reasonable, effectively reduces the horizontal width of the shift register unit, and the vertical height of the shift register unit.

In at least one embodiment of the present disclosure, the second predetermined distance may be selected according to actual conditions, for example, the second predetermined distance is greater than or equal to 20 um (micrometers) and less than or equal to 30 um.

In at least one embodiment of the present disclosure, the maximum distance in the second direction between the gate electrode G6 of the first capacitor connection transistor T6 and the gate electrode G5 of the second capacitor connection transistor T5 refers to: the maximum distance in the second direction between any point on the edge line of G5 and the edge line of G6, as shown in FIG. 10C, d4 is the maximum distance in the second direction between any point on the edge line of G5 and the edge line of G6.

In a specific implementation, as shown in FIG. 1, the at least one shift register unit may include a first transistor T8 and a second transistor T7.

Figure 9:
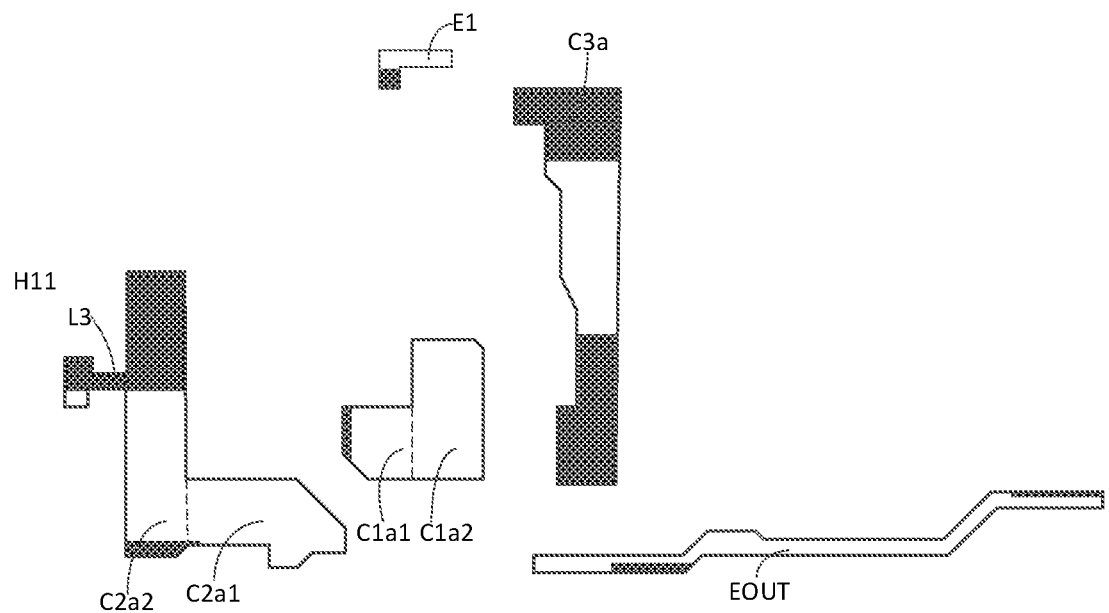
FIG. 9 is a schematic diagram of the division of electrode plates of the capacitor on the basis of FIG. 6.

As shown in FIG. 9, based on FIG. 6, the first electrode plate C1a of the first capacitor C1 includes a first horizontal plate portion C1a1 and a first vertical plate portion C1a2.

As shown in FIGS. 3 and 9, the orthographic projection of the gate electrode G5 of the second capacitor connection transistor T5 on the substrate and the orthographic projection of the first horizontal plate portion C1a1 on the substrate are arranged along the first direction.

The orthographic projection of the gate electrode G8 of the first transistor T8 on the substrate, the orthographic projection of the gate electrode G7 of the second transistor T7 on the substrate, and the orthographic projection of the first vertical plate portion C1a2 on the substrate are arranged along the first direction.

The orthographic projection of the first vertical plate portion C1a2 on the substrate is arranged between the orthographic projection of the second electrode D6 of the first capacitor connection transistor T6 on the substrate and the orthographic projection of the first electrode S5 of the second capacitor connection transistor T5 on the substrate.

The first electrode S7 of the second transistor T7 is coupled to the second electrode plate C3b of the output capacitor C3.

In at least one embodiment of the present disclosure, a space between T5 and T6 and a space below T5 are used to set C1, and the electrode plate of C1 is set in an L shape for a reasonable layout.

In at least one embodiment of the present disclosure, the second electrode D7 of the second transistor T7 is coupled to the first conductive connection portion L1 through the sixth connection via hole H86, so that the second electrode D7 of the second transistor T7 is coupled to the second electrode D6 of the first capacitor connection transistor T6.

Optionally, as shown in FIG. 1, the at least one shift register unit may further include a first node control transistor T2 and a second capacitor C2.

As shown in FIG. 5, a first gate pattern G21 and a second gate pattern G22 included in the gate electrode the first node control transistor T2 are respectively coupled to the second electrode plate C2b of the second capacitor C2.

As shown in FIGS. 3, 5, and 6, the orthographic projection of the first electrode plate C2a of the second capacitor C2 on the substrate is within the orthographic projection of the second electrode plate C2b of the second capacitor C2 on the substrate.

The first electrode plate C2a of the second capacitor C2 is of an L shape.

As shown in FIG. 9, on the basis of FIG. 6, the first electrode plate C2a of the second capacitor C2 includes a second horizontal plate portion C2a1.

The orthographic projection of the gate electrode G2 of the first node control transistor T2 on the substrate and the orthographic projection of the second horizontal plate portion C2a1 on the substrate are arranged along the first direction.

In at least one embodiment of the present disclosure, the electrode plate of C2 is set in an L shape, and a horizontal plate portion included in the electrode plate of C2 is placed in the space below T2 to reduce the lateral width of the shift register unit.

In at least one embodiment of the present disclosure, as shown in FIGS. 3 and 8, the scan driving circuit further includes a third voltage signal line VGL2; the third voltage signal line VGL2 extends along the first direction.

The first node control transistor T2 is located on the side of the second capacitor connection transistor T5 away from the first voltage signal line VGH; the first node control transistor T2 is located between the third voltage signal line VGL2 and the first voltage signal lines VGH.

As shown in FIG. 9, the first electrode plate C2a of the second capacitor C2 further includes a second vertical plate portion C2a2 coupled to the second horizontal plate portion C2a1; the orthographic projection of the second vertical plate portion C2a2 on the substrate partially overlaps the orthographic projection of the third voltage signal line VGL2 on the substrate.

Specifically, the electrode plate of C2 is set in an L shape, and the orthographic projection of the second vertical plate portion C2a2 of C2 on the substrate partially overlaps the orthographic projection of the third voltage signal line VGL2 on the substrate, to reduce the vertical height of the shift register unit.

Figure 4:
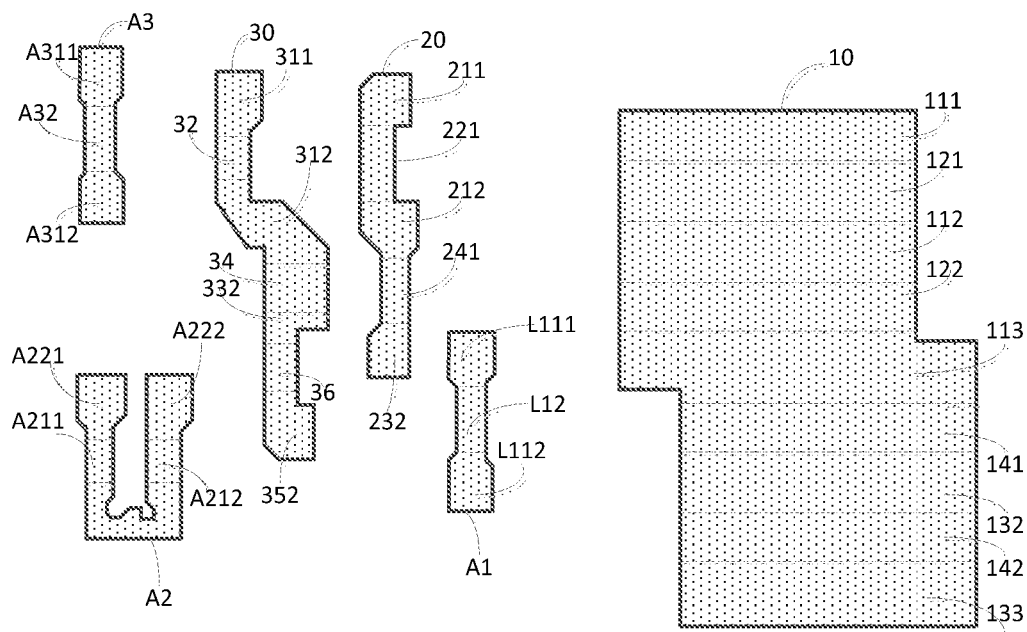
FIG. 4 is a schematic diagram of an active layer in the shift register unit according to at least one embodiment of the present disclosure.

As shown in FIGS. 3, 4 and 9, the orthographic projection of the second active pattern A2 of T2 on the substrate and the orthographic projection of the second horizontal plate portion C2a1 on the substrate are arranged in sequence along the first direction, the space below A2 is used to set the horizontal plate portion of C2.

As shown in FIG. 3, the display substrate according to at least one embodiment of the present disclosure includes a substrate, and a scan driving circuit disposed on the substrate, the scan driving circuit includes a plurality of shift register units; the scan driving circuit also includes a first voltage signal line VGH and a second voltage signal line VGL1.

At least one shift register unit of the plurality of shift register units includes an output circuit O1; the output circuit O1 is respectively coupled to the first voltage signal line VGH and the second voltage signal line VGL1.

The transistor included in the output circuit O1 is disposed between the first voltage signal line VGH and the second voltage signal line VGL1.

In a specific implementation, the first voltage signal line VGH and the second voltage signal line VGL1 may extend along a first direction.

In a specific implementation, the first voltage signal line VGH may be located on a side of the second voltage signal line VGL1 away from the display area.

In the display substrate according to at least one embodiment of the present disclosure, the output circuit O1 is disposed between the first voltage signal line VGH and the second voltage signal line VGL1, so that in the spatial structure, the first voltage signal line VGH is disposed on a side of the output circuit O1 away from the display area, and no other signal lines and other members included in transistors are arranged between the first voltage signal line VGH and the output circuit O1, and the second voltage signal line VGL1 is disposed on a side of the output circuit close to the display area, no other signal lines and other members included in transistors are provided between the second voltage signal line VGL1 and the output circuit O1, and the distance between the first voltage signal line VGH and the output circuit O1 can be reduced, the distance between the second voltage signal line VGL1 and the output circuit O1 can be reduced, so that the lateral width of the shift register unit is reduced.

Specifically, the output circuit includes an output transistor and an output reset transistor. The output reset transistor and the output transistor are arranged along a first direction. A first electrode of the output reset transistor is coupled to the first voltage signal line, and a first electrode of the output transistor is coupled to the second voltage signal line.

As shown in FIG. 3, the output circuit O1 includes an output reset transistor T9 and an output transistor T10. The output reset transistor T9 and the output transistor T10 are arranged sequentially from top to bottom, the first electrode S9 of the output reset transistor T9 is coupled to the first voltage signal line VGH, and the first electrode S10 of the output transistor T10 is coupled to the second voltage signal line VGL1.

In at least one embodiment of the present disclosure, the at least one shift register unit may further include a signal output line. The output transistor and the signal output line are arranged along a first direction, and the second electrode of the output transistor and the second electrode of the output reset transistor are both coupled to the signal output line. The signal output line extends along a second direction, and the first direction intersects the second direction.

In specific implementation, the at least one shift register unit may further include a signal output line, and the output transistor and the output reset transistor are both coupled to the signal output line, then the output transistor and the output reset transistor should be close to the signal output line. In at least one embodiment of the present disclosure, the signal output line is moved down to between the output circuits of adjacent shift register units to reduce the lateral width of the shift register unit.

In at least one embodiment of the present disclosure, the output reset transistor T9 is used to provide an invalid light emitting control signal, and the output transistor T10 is used to provide a valid light emitting control signal.

In at least one embodiment of the present disclosure, the valid light emitting control signal may be a voltage signal capable of turning on the light emitting control transistor in the pixel circuit (the gate electrode the light emitting control transistor is coupled to the light emitting control line), the invalid light emitting control signal may be a voltage signal capable of turning off the light emitting control transistor.

Specifically, the display area of the display substrate includes a plurality of sub-pixels; at least one of the plurality of sub-pixels includes a pixel driving circuit; the pixel driving circuit includes a driving transistor, a gate line, a light emitting control line, and a data line. The driving transistor is configured to drive the light emitting element for display; the scanning driving circuit includes a plurality of shift register units corresponding to a plurality of light emitting control lines in a one-to-one manner, and the signal output line of each shift register unit is coupled to the corresponding light emitting control line, to provide a lighting control signal for the corresponding lighting control line.

In at least one embodiment of the present disclosure, the active layer of the output transistor and the active layer of the output reset transistor are formed by a continuous first semiconductor layer. The first semiconductor layer and the signal output line are arranged along a first direction.

In specific implementation, the active layer of the output transistor and the active layer of the output reset transistor may be formed by a continuous first semiconductor layer, but it is not limited to this.

In at least one embodiment of the present disclosure, the active layer of the output transistor and the active layer of the output reset transistor may be formed by a continuous first semiconductor layer.

The active layer of the output reset transistor includes at least one first conductive portion and at least one first channel portion arranged opposite to each other in a first direction; each of the first channel portions is arranged between two adjacent first conductive portions.

The active layer of the output transistor may include at least two second conductive portions and at least one second channel portion arranged opposite to each other along the first direction; each of the second channel portions is arranged between two adjacent second conductive portions.

The first conductive portion of the active layer of the output reset transistor that is closest to the active layer of the output transistor can be reused as the second conductive portion of the output transistor, which can further reduce the layout space of the output transistor and the output reset transistor, which is beneficial to realize the narrow frame of the display substrate.

As shown in FIG. 4, the active layer of the output reset transistor T9 and the active layer of the output transistor T10 may be formed by a continuous first semiconductor layer 10.

The active layer of the output reset transistor T9 includes a first one of first conductive portions 111, a second one of first conductive portions 112, and a third one of first conductive portions 113 that are arranged oppositely along a first direction. The active layer of the output reset transistor T9 also includes a first one of first channel portions 121 and a second one of first channel portions 122.

The first one of first channel portions 121 is disposed between the first one of first conductive portions 111 and the second one of first conductive portions 112, and the second one of first channel portions 122 is disposed between the second one of first conductive portions 112 and the third one of first conductive portions 113.

The first conductive portion 113 is reused as the first one of second conductive portions included in the active layer of the output transistor T10.

The active layer of the output transistor T10 further includes a second one of second conductive portions 132 and a third one of second conductive portions 133 arranged opposite to each other along the first direction, and the active layer of the output transistor T10 further includes a first one of second channel portions 141 and a second one of second channel portions 142.

The first one of second channel portions 141 is disposed between the first one of second conductive portions and the second one of second conductive portions 132, and the second one of second channel portions 142 is disposed between the second one of second conductive portions 132 and the third one of second conductive portions 133.

In the output reset transistor T9 and the output transistor T10, the conductive portions on both sides of the channel portion of each transistor may be used as the first electrode and the second electrode of the transistor, or may be connected to the first electrode and the second electrode of the transistor, so that T9 and T10 can be directly electrically connected to the third one of first conductive portions 113.

When forming the first semiconductor layer 11, for example, the first semiconductor material layer may be formed first, and then the gate electrode G9 of the output reset transistor T9 and the gate electrode G10 of the output transistor T10 are formed. The gate electrode G9 of the output transistor T10 and the gate electrode G10 of the output transistor T10 are used an a mask to dope a portion of the first semiconductor material layer that is not covered by the gate electrode of each transistor, so that a part of the first semiconductor material layer that is not covered by the gate electrode of each transistor is formed as the conductive portion, and another part of the first semiconductor material layer that is covered by each transistor is formed as the channel portion.

According to the specific structure of the above display substrate, in the display substrate according to at least one embodiment of the present disclosure, the output reset transistor T9 and the output transistor T10 in the shift register unit can be arranged along the first direction, which reduces the area occupied by the shift register unit in the second direction, and makes the display substrate more in line with the development demand of narrow frame.

Specifically, the gate electrode the output reset transistor may include at least one output reset gate pattern, the first electrode of the output reset transistor includes at least one first electrode pattern, and the second electrode of the output reset transistor includes at least one second electrode pattern. The output reset gate pattern is located between the first electrode pattern and the second electrode pattern adjacent to each other. The second electrode pattern, the output reset gate pattern, and the first electrode pattern all extend along a second direction. The first direction intersects the second direction.

Specifically, the gate electrode of the output transistor may include at least one output gate pattern, the first electrode of the output transistor includes at least one third electrode pattern, and the second electrode of the output transistor includes at least one fourth electrode pattern. The output gate pattern is located between the third electrode pattern and the fourth electrode pattern adjacent to each other. The fourth electrode pattern, the output gate pattern, and the third electrode pattern all extend along the second direction. The first direction intersects the second direction. The second electrode pattern of the output reset transistor closest to the gate electrode the output transistor is reused as a fourth electrode pattern of the output transistor.

In specific implementation, the number of output reset gate patterns, the number of first electrode patterns, the number of second electrode patterns, the number of output gate patterns, and the number of third electrode patterns and the number of the fourth electrode patterns can be set according to actual needs. For example, as shown in FIGS. 5 and 8, the number of output gate patterns and the number of output reset gate patterns may be two, and the number of first electrode patterns and the number of third electrode patterns may be one. The number of the second electrode pattern and the number of fourth electrode pattern may be two.

In addition, since the second electrode of the output transistor and the second electrode of the output reset transistor are both coupled to the signal output line, when the output transistor and the output reset transistor are laid out, the second electrode pattern of the output reset transistors closest to the gate electrode of the output transistor is reused as the fourth electrode pattern of the output transistor, which can further reduce the layout space of the output transistor and the output reset transistor, which is beneficial to realize the narrow frame of the display substrate.

As shown in FIGS. 3 and 5, in some embodiments, the gate electrode G9 of the output reset transistor T9 may include: a first output reset gate pattern G91 and a second output reset gate pattern G92.

The gate electrode G10 of the output transistor T10 may include: a first output gate pattern G101 and a second output gate pattern G102.

The first output reset gate pattern G91, the second output reset gate pattern G92, the first output gate pattern G101, and the second output gate pattern G102 are arranged in sequence along the first direction.

The first output reset gate pattern G91, the second output reset gate pattern G92, the first output gate pattern G101 and the second output gate pattern G102 all extend along the second direction, and the second direction intersects the first direction.

The first output reset gate pattern G91 and the second output reset gate pattern G92 are coupled to each other, and the first output gate pattern G101 and the second output gate pattern G102 are coupled to each other.

As shown in FIG. 8, the second electrode D9 of the output reset transistor T9 includes a first one of second electrode patterns D91 and a second one of second electrode patterns D92.

D91, S9, and D92 are sequentially arranged along the first direction, and D91, S9, and D92 all extend along the second direction, and S9 is coupled to the first voltage signal line VGH.

D92 is reused as the first one of fourth electrode patterns in the second electrode D10 of the output transistor T10.

The second electrode D10 of the output transistor T10 further includes a second one of fourth electrode patterns D102.

D92, S10 and D102 are arranged in sequence along the first direction; S10 is coupled to the second voltage signal line VGL1.

As shown in FIGS. 3, 5, and 8, the orthographic projection of G91 on the substrate is set between the orthographic projection of D91 on the substrate and the orthographic projection of S9 on the substrate. The orthographic projection of G92 on the substrate is set between the orthographic projection of S9 on the substrate and the orthographic projection of D92 on the substrate. The orthographic projection of G101 on the substrate is set between the orthographic projection of D92 on the substrate and the orthographic projection of S10 on the substrate. The orthographic projection of G102 on the substrate is between the orthographic projection of S10 on the substrate and the orthographic projection of D102 on the substrate.

In at least one embodiment of the present disclosure, when the shift register unit included in the scan driving circuit is in operation, and T10 is turned on, the shift register unit remains outputting a low voltage signal. In order to maintain a stable voltage signal connected to the gate electrode of T10, the overlapping of the gate electrode G10 of T10 and the clock signal line should be avoided. Here, G10 is set to overlap the second voltage signal line VGL1

(VGL1 is the DC voltage signal line), and the influence on the voltage signal applied to the gate electrode G10 of T10 is minimized.

In a specific implementation, the active layer of the output reset transistor may include at least two first conductive portions and at least one first channel portion arranged oppositely along the first direction; each of the first channel portions is arranged between two adjacent first conductive portions.

The first channel portions correspond to the output reset gate patterns in the one-to-one manner, and the orthographic projection of each first channel portion on the substrate is located within the orthographic projection of the corresponding output reset gate pattern on the substrate.

A part of the first conductive portions in the output reset transistor corresponds to the first electrode patterns in the one-to-one manner, and the orthographic projection of the first electrode pattern on the substrate and the orthographic projection of the corresponding first conductive portion on the substrate have a second overlapping area, and the first electrode pattern is coupled to the corresponding first conductive portion through at least one second via hole provided in the second overlapping area.

Another part of the first conductive portions in the output reset transistor correspond to the second electrode pattern in the one-to-one manner, and the orthographic projection of the second electrode pattern on the substrate and the orthographic projection of the corresponding first conductive portion on the substrate have a third overlapping area, and the second electrode pattern is coupled to the corresponding first conductive portion through at least one third via hole provided in the third overlapping area.

In a specific implementation, the active layer of the output transistor may include at least two second conductive portions and at least one second channel portion arranged oppositely along the first direction; each of the second channel portions is arranged between two adjacent second conductive portions.

The second channel portions correspond to the output gate patterns in the one-to-one manner, and the orthographic projection of each second channel portion on the substrate is located within the orthographic projection of the corresponding output gate pattern on the substrate.

A part of the second conductive portions in the output transistor correspond to the third electrode patterns in the one-to-one manner, and the orthographic projection of the third electrode pattern on the substrate and the orthographic projection of the second conductive portion on the substrate have a fourth overlapping area, and the third electrode pattern is coupled to the corresponding second conductive portion through at least one fourth via hole provided in the fourth overlapping area.

Another part of the second conductive portions in the output transistor correspond to the fourth electrode patterns in the one-to-one manner, and the orthographic projection of the fourth electrode pattern on the substrate and the orthographic projection of the corresponding second conductive portion on the substrate have a fifth overlapping area, and the fourth electrode pattern is coupled to the corresponding second conductive portion through at least one fifth via hole provided in the fifth overlapping area.

As shown in FIGS. 4, 5, 7 and 8, the first one of first channel portions 121 corresponds to the first output reset gate pattern G91, and the second one of first channel portions 122 corresponds to the second output reset gate pattern G92.

The orthographic projection of the first one of first channel portions 121 on the substrate is located within the orthographic projection of G91 on the substrate.

The orthographic projection of the second one of first channel portions 122 on the substrate is located within the orthographic projection of G92 on the substrate.

The first one of first conductive portions 111 corresponds to the first one of second electrode patterns D91, the second one of first conductive portions 112 corresponds to the first electrode S9 of the output reset transistor, and the third one of first conductive portions 113 corresponds to the second one of second electrode patterns D92.

The orthographic projection of S9 on the substrate and the orthographic projection of the second one of first conductive portions 112 on the substrate have a second overlapping area, and S9 is coupled to the second one of first conductive portions 112 through at least one second via hole H2 provided in the second overlapping area.

The orthographic projection of D91 on the substrate and the orthographic projection of the first one of first conductive portions 111 on the substrate have a first one of third overlapping areas, and D91 is coupled to the first one of first conductive portions 111 through at least one third via hole H3 provided in the first one of third overlapping areas.

The orthographic projection of D92 on the substrate and the orthographic projection of the third one of first conductive portions 113 on the substrate have a second one of third overlapping areas, and D92 is coupled to the third one of first conductive portions 113 through at least one of third via hole H3 provided in the second one of third overlapping areas.

The first one of second channel portions 141 corresponds to the first output gate pattern G101, and the second one of second channel portions 142 corresponds to the second output gate pattern G102.

The orthographic projection of the first one of second channel portions 141 on the substrate is located within the orthographic projection of G101 on the substrate.

The orthographic projection of the second one of second channel portions 142 on the substrate is located within the orthographic projection of G102 on the substrate.

D92 is reused as the first one of fourth electrode patterns; the third one of first conductive portions 113 is reused as the first one of second conductive portions.

The first one of second conductive portions corresponds to the first one of fourth electrode patterns.

The second one of second conductive portions 132 corresponds to the first electrode S10 of the output transistor, and the third one of second conductive portions 133 corresponds to the second one of fourth electrode patterns D102.

The orthographic projection of S10 on the substrate and the orthographic projection of the second one of second conductive portions 132 on the substrate have a fourth overlapping area. S10 is coupled to the second one of second conductive portions 132 through at least one fourth via hole H4 provided in the fourth overlapping area.

The orthographic projection of D102 on the substrate and the orthographic projection of the third one of second conductive portions 133 on the substrate have a fifth overlapping area. D102 is coupled to the third one of second conductive portions 133 through at least one fifth via hole H5 arranged in the fifth overlapping area.

In at least one embodiment of the present disclosure, the number of first via holes, the number of second via holes, the number of third via holes, and the number of fourth via holes can be set according to actual needs.

In the display substrate provided by the foregoing embodiment, the first semiconductor layer 10 extending in the first direction is used to form the active layer of the output reset transistor T9 and the active layer of the output transistor T10, which not only makes T9 and T10 occupy a small space in the second direction, but also makes the size of the active layer of the output reset transistor T9 and the active layer of the output transistor T10 in the first direction to be increased to ensure the channel width of T9 and the channel width of T10, thereby reducing the frame width of the display substrate while ensuring the working performance of T9 and T10.

As shown in FIGS. 3, 4 and 6, the orthographic projection of the signal output line EOUT on the substrate is arranged between the orthographic projection of the first semiconductor layer 10 in the nth stage of shift register unit on the substrate and the orthographic projection of the first semiconductor layer in the (n+1)th stage of shift register unit on the substrate, the first semiconductor layer 10 and the signal output line EOUT are arranged along the first direction, which can reduce the lateral width of the shift register unit.

In at least one embodiment of the present disclosure, FIG. 4 is a schematic diagram of the active layer in FIG. 3, FIG. 5 is a schematic diagram of the first gate metal layer in FIG. 3, and FIG. 6 is a schematic diagram of the second gate metal layer in FIG. 3, FIG. 7 is a schematic diagram showing the forming of via holes after the active layer, the first gate metal layer, and the second gate metal layer are sequentially arranged, and FIG. 8 is a schematic diagram of the source-drain metal layers in FIG. 3.

In specific implementation, an active layer, a first gate metal layer, a second gate metal layer, a via hole, and a source-drain metal layer are sequentially arranged on the substrate base to form a display substrate.

In at least one embodiment of the present disclosure, in addition to an output transistor and an output reset transistor, the shift register unit also includes a plurality of transistors; the conductive portions on both sides of the channel portion of each transistor may correspond to the first electrode and the second electrode of the transistor, or may be respectively correspond to the first electrode of the transistor and the second electrode of the transistor.

In at least one embodiment of the present disclosure, as shown in FIG. 2, the at least one shift register unit may further include an output capacitor C3 and a first transistor T8.

As shown in FIGS. 3, 6 and 7, the orthographic projection of the first electrode plate C3a of the output capacitor C3 on the substrate and the orthographic projection of the first voltage signal line VGH on the substrate have the signal line overlapping area, the first electrode plate C3a of the output capacitor C3 is coupled to the first voltage signal line VGH through at least one signal line via hole H01 provided in the signal line overlapping area.

The first transistor T8 is located on a side of the first voltage signal line VGH away from the output reset transistor T9.

As shown in FIG. 8, the at least one shift register unit further includes an electrode plate conductive connection portion 71 coupled with the second electrode D8 of the first transistor T8.

As shown in FIGS. 3, 4, 7 and 8, the second electrode D8 of the first transistor T8 is coupled to the electrode plate conductive connection portion 71 through a first connection via hole H81.

As shown in FIGS. 3, 5, 7 and 8, the orthographic projection of the electrode plate conductive connection portion 71 on the substrate and the orthographic projection of the second electrode plate C3b of the output capacitor C3 on the substrate have an electrode plate overlapping area, and the electrode plate conductive connection portion 71 is coupled to the second electrode plate C3b of the output capacitor C3 through at least one electrode plate via hole H02 provided in the electrode plate overlapping area.

The first electrode S8 of the first transistor T8 is coupled to the first voltage signal line VGH.

In specific implementation, as shown in FIG. 7, the first electrode S8 of the first transistor T8 is coupled to the first voltage signal line VGH through the second connection via hole H82.

In at least one embodiment of the present disclosure, T8 is moved to the left side of the first voltage signal line VGH, and the orthographic projection of the electrode plate of the output capacitor C3 on the substrate partially overlaps the orthographic projection of the first voltage signal line VGH on the substrate so as to reduce the distance between the first electrode S8 of the first transistor T8 and the first voltage signal line VGH, and reduce the distance between the second electrode D8 of the first transistor T8 and the second electrode plate C3b of the output capacitor C3, so that T8 may be easily coupled to the first voltage signal line VGH and the second electrode plate C3b of the output capacitor C3, the space is compact and the layout is more reasonable.

The maximum distance in the second direction between the orthographic projection of the first electrode S8 of the first transistor T8 on the substrate and the orthographic projection of the first voltage signal line VGH on the substrate is smaller than a third predetermined distance, the maximum distance in the second direction between the orthographic projection of the second electrode D8 of the first transistor T8 on the substrate and the orthographic projection of the second electrode plate C3b of the output capacitor C3 on the substrate is smaller than a fourth predetermined distance, so that the first transistor T8 is close to the first voltage signal line VGH and the output capacitor C3, which shortens the lateral width of the shift register unit, and facilitates the realization of a narrow frame.

In at least one embodiment of the present disclosure, the third predetermined distance and the fourth predetermined distance can be selected according to actual conditions, for example, the third predetermined distance is greater than or equal to 20 microns and less than or equal to 30 microns, so the fourth predetermined distance is greater than or equal to 25 microns and less than or equal to 35 microns.

In at least one embodiment of the present disclosure, S8 and D8 are disposed on the active layer. As shown in FIG. 4, the first one of third conductive portions 211 is used as the first electrode S8 of the first transistor T8. The second one of third conductive portions 212 is used as the second electrode D8 of the first transistor T8.

In at least one embodiment of the present disclosure, the maximum distance in the second direction between the orthographic projection of the first electrode S8 of the first transistor T8 on the substrate and the orthographic projection of the first voltage signal line VGH on the substrate refers to the maximum distance in the second direction between any point on the edge line of the orthographic projection of the first electrode S8 of the first transistor T8 on the substrate and the edge line of the orthographic projection of the first voltage signal line VGH on the substrate.

The maximum distance in the second direction between the orthographic projection of the second electrode D8 of the first transistor T8 on the substrate and the orthographic projection of the second electrode plate C3b of the output capacitor C3 on the substrate refers to: the maximum distance in the second direction between any point on the edge line of the orthographic projection of the second electrode D8 of the first transistor T8 on the substrate and the edge line of the orthographic projection of the second electrode plate C3b of the output capacitor C3 on the substrate.

In FIG. 10A, only the orthographic projection of the second semiconductor layer (the second semiconductor layer including the first one of third conductive portions 211 and the second one of third conductive portions 212) on the substrate and the orthographic projection of the first voltage signal line VGH on the substrate as shown in FIG. 4.

In FIG. 10B, only the orthographic projection of the second semiconductor layer (the second semiconductor layer including the first one of third conductive portions 211 and the second one of third conductive portions 212) on the substrate and the orthographic projection of the second electrode plate of the output capacitor C3 on the substrate as shown in FIG. 4.

In FIGS. 10A and 10B, the label X1 is the edge line of the orthographic projection of the first electrode S8 of the first transistor T8 on the substrate, and the label X2 is the edge line of the orthographic projection of first voltage signal line VGH on the substrate, the label X3 is the edge line of the orthographic projection of the second electrode D8 of the first transistor T8 on the substrate, and the label X4 is the edge line of the orthographic projection of the second electrode plate C3b of the output capacitor C3 on the substrate.

In FIG. 10A, dl is the maximum distance in the second direction between the orthographic projection of the first electrode S8 of the first transistor T8 on the substrate and the orthographic projection of the first voltage signal line VGH on the substrate.

In FIG. 10B, d2 is the maximum distance in the second direction between the orthographic projection of the second electrode D8 of the first transistor T8 on the substrate and the orthographic projection of the second electrode plate C3b of the output capacitor C3 on the substrate.

Specifically, as shown in FIG. 5, a first output reset gate pattern G91 and a second output reset gate pattern G92 included in the gate electrode G9 of the output reset transistor T9 are coupled to the second electrode plate C3b of the output capacitor C3.

As shown in FIGS. 3 and 6, the orthographic projection of the first electrode plate C3a of the output capacitor C3 on the substrate at least partially overlaps the orthographic projection of the second electrode plate C3b of the output capacitor C3 on the substrate.

In a specific implementation, the display substrate may further include a third voltage signal line; the third voltage signal line is located on a side of the first transistor away from the first voltage signal line. The third voltage signal line extends along the first direction.

In at least one embodiment of the present disclosure, the third voltage signal line may be a low voltage signal line, and the low voltage provided by the third voltage signal line may be the same as the low voltage provided by the first voltage signal line, but is not limited herein.

Specifically, the first transistor may be arranged between the first voltage signal line and the third voltage signal line.

In at least one embodiment of the present disclosure, as shown in FIG. 3, the at least one shift register unit may further include a second transistor T7.

As shown in FIG. 4, the active layer of the first transistor T8 and the active layer of the second transistor T7 are formed by a continuous second semiconductor layer 20; the second semiconductor layer 20 extends along the first direction.

The active layer of the first transistor T8 includes a first one of third conductive portions 211, a third channel portion 221, and a second one of third conductive portions 212 sequentially arranged along the first direction.

The second one of third conductive portions 212 is reused as the first one of fourth conductive portions.

The active layer of the second transistor T7 includes a first one of fourth conductive portions, the fourth channel portion 241, and a second one of fourth conductive portions 232 sequentially arranged along the first direction.

As shown in FIGS. 3 and 8, the second electrode D8 of the first transistor T8 is reused as the first electrode S7 of the second transistor T7.

In at least one embodiment of the present disclosure, the first one of third conductive portions 211 is used as the first electrode S8 of the first transistor T8, and the second one of third conductive portions 212 is used as the second electrode D8 of first transistor T8; the second one of fourth conductive portions 232 is reused as the second electrode D7 of the second transistor T7.

In at least one embodiment of the present disclosure, T7 is arranged between T8 and C1, and the second electrode S8 of T8 is reused as the second electrode of T7 to narrow the lateral width of the shift register unit while reducing the vertical height of the shift register unit. As shown in FIGS. 1 and 3, the display substrate may further include a first clock signal line CB, the first clock signal line CB extends in a first direction, and the first clock signal line CB is located in a side of the third voltage signal line VGL2 away from the first voltage signal line VGH.

The output circuit includes an output transistor T10, as shown in FIG. 5, the at least one shift register unit further includes the second conductive connection portion L2 arranged between the gate electrode G10 of the output transistor T10 and the second electrode plate C2b of the second capacitor C2. The second conductive connection portion L2 is respectively coupled to the gate electrode G10 of the output transistor T10 and the second electrode plate C2b of the second capacitor C2.

The at least one shift register unit further includes a third conductive connection portion L3 coupled to the first electrode plate C2a of the second capacitor C2.

As shown in FIGS. 3 and 7, the orthographic projection of the third conductive connection portion L3 on the substrate and the orthographic projection of the first clock signal line CB on the substrate have a sixth overlapping area. The clock signal line CB is coupled to the first electrode plate C2a of the second capacitor C2 through at least one sixth via hole H6 provided in the sixth overlapping area.

Optionally, the second conductive connection portion L2 may extend along the second direction and is used to couple the gate electrode G10 of the output transistor T10 to the second electrode plate C2b of the second capacitor C2.

The third conductive connection portion L3 may extend along the second direction, and the third conductive connection portion L3 is coupled to the first electrode plate C2a of the second capacitor C2 through a sixth via hole H6.

Specifically, as shown in FIGS. 3 and 4, the first capacitor connection transistor T6 includes a first active pattern A1; the first active pattern A1 extends along a first direction.

The first active pattern includes a first one of first capacitor connection conductive portions L111 and a second one of first capacitor connection conductive portions L112 arranged opposite to each other along the first direction A1, and a first capacitor channel conductive portion L12 arranged between the first one of first capacitor connection conductive portions L111 and the second of the first capacitor connection conductive portions L112.

In at least one embodiment of the present disclosure, the first one of first capacitor connection conductive portions L111 is used as the first electrode S6 of the first capacitor connection transistor T6, and the second one of first capacitor connection conductive portions L112 is used as the second electrode D6 of the first capacitor connection transistor T6.

Optionally, the first active pattern A1 of T6 extends along the first direction, and T6 is disposed between T5 and VGH, so as to narrow the lateral width of the shift register unit.

In specific implementation, as shown in FIG. 1 and FIG. 3, the at least one shift register unit may include a second transistor T7. A second electrode D7 of the second transistor T7 is coupled to the first conductive connection portion L1.

As shown in FIGS. 3, 7 and 8, the second electrode D7 of the second transistor T7 is coupled to the first conductive connection portion L1 through a sixth connection via hole H86.

Specifically, as shown in FIG. 4, the first node control transistor T2 may include a second active pattern A2; the second active pattern A2 may be of a U shape.

The second active pattern A2 includes a first one of first node control channel portions A211, a second one of first node control channel portions A212, a first one of first node control conductive portions A221, and a second one of first node control conductive portions A222.

As shown in FIG. 5, the gate electrode the first node control transistor T2 includes a first gate pattern G21 and a second gate pattern G22 that are coupled to each other. The first gate pattern G21 corresponds to the first one of first node control channel portions A211, and the second gate pattern G22 corresponds to the second one of first node control channel portions A212.

As shown in FIGS. 3 and 4, the first one of first node control conductive portions A221 is used as the second electrode D2 of the first node control transistor T2, and the second one of first node control conductive portions A222 is used as the first electrode S2 of the first node control transistor T2.

As shown in FIGS. 3 and 4, the active pattern of the first node control transistor T2 is configured as a U-shaped structure, so that T2 is formed as a double-gate structure. The purpose of the double-gate structure design is: in the second phase P2, when the shift register unit included in the scan driving circuit outputs a high voltage signal Vgh, T10 should be completely turned off, and the high level inputted to the gate electrode of T10 is provided by the source electrode of T5. Therefore, in the second phase P2, it is necessary to ensure that T5 is turned on, that is, the potential of the second node N2 needs to be a low level; and in the second phase P2, the potential of the gate electrode T2 is a high level to ensure that the potential of the second node N2 does not increase due to the current leak of T2, so T2 is designed as a double-gate structure, which makes it easier to turn off T2.

In actual exposure process, if the active pattern of T2 is designed to a U shape without corners missing, metal will be deposited after the exposure process, which will make the U-shaped active pattern to be a V-shape. Therefore, in actual products, taking into account the actual exposure process, a small portion of two right-angled portions inside the U-shaped active pattern is dug out for compensation, so that the actual pattern is made to be a U shape as much as possible, without affecting the width to length ratio of T2.

In at least one embodiment of the present disclosure, as shown in FIGS. 1 and 3, the at least one shift register unit may further include a second node control transistor T3; the at least one shift register unit includes a second capacitor connection transistor T5.

As shown in FIGS. 4 and 8, the second electrode D3 of the second node control transistor T3 and the second electrode D2 of the first node control transistor T2 are coupled through a fourth conductive connection portion L4.

As shown in FIGS. 3, 4, 5 and 8, the at least one shift register unit further includes a fifth conductive connection portion L5 coupled to the gate electrode G5 of the second capacitor connection transistor T5. There is a seventh overlapping area between the orthographic projection of the fifth conductive connection portion L5 on the substrate and the orthographic projection of the fourth conductive connection portion L4 on the substrate.

The fifth conductive connection portion L5 is coupled to the fourth conductive connection portion L4 through a seventh via hole H7 provided in the seventh overlapping area.

In specific implementation, as shown in FIG. 3, FIG. 4, FIG. 7 and FIG. 8, the second electrode D3 of the second node control transistor T3 is coupled to the fourth conductive connection portion L4 through a seventh connection via hole H87. Then, the second electrode D2 of the first node control transistor T2 is coupled to the fourth conductive connection portion L4 through the eighth connection via hole H88, so that the second electrode D3 of the second node control transistor T3 is coupled to the second electrode D2 of the first node control transistor T2.

In at least one embodiment of the present disclosure, the fourth conductive connection portions L4 may be arranged along the first direction to reduce the lateral width of the shift register unit.

In specific implementation, as shown in FIGS. 1 and 3, the display substrate may further include a third voltage signal line VGL2; the third voltage signal line VGL2 is arranged at a side of the second node control transistor T3 far away from the first voltage signal line VGH.

As shown in FIGS. 3, 4, and 5, the first electrode S2 of the first node control transistor T2 is coupled to the sixth conductive connection portion L6; the gate electrode G3 of the second node control transistor T3 is coupled to the seventh conductive connection portion L7.

There is an eighth overlapping area between the orthographic projection of the sixth conductive connection portion L6 on the substrate and the orthographic projection of the seventh conductive connection portion L7 on the substrate, and the sixth conductive connection portion L6 is coupled to the seventh conductive connection portion L7 through the eighth via hole H8 provided in the eighth overlapping area.

The first electrode S3 of the second node control transistor T3 is coupled to the third voltage signal line VGL2.

As shown in FIGS. 3 and 7, the first electrode S2 of the first node control transistor T2 is coupled to the sixth conductive connection portion L6 through a ninth connection via hole H89, and the sixth conductive connection portion L6 may extend along the first direction to narrow the lateral width of the shift register unit.

As shown in FIG. 5, the gate electrode G3 of the second node control transistor T3 is coupled to the seventh conductive connection portion L7, and the sixth conductive connection portion L6 is coupled to the seventh conductive connection portion L6 through the eighth via hole H8 provided in the eighth overlapping area, so that the first electrode S2 of the first node control transistor T2 is coupled to the gate electrode G3 of the second node control transistor T3.

As shown in FIG. 4, the second node control transistor T3 includes a third active pattern A3, and the third active pattern includes a first control conductive portion A311, a control channel portion A32, and a second control conductive portion A312 arranged in sequence along the first direction.

The first control conductive portion A311 is used as the first electrode S3 of T3, and the second control conductive portion A312 is used as the second electrode D3 of T3.

Specifically, as shown in FIGS. 1 and 3, the display substrate may further include a second clock signal line CK, and the second clock signal line CK extends along the first direction.

As shown in FIG. 5, the gate electrode G3 of the second node control transistor T3 is also coupled to the eighth conductive connection portion L8; as shown in FIG. 3, there is a ninth overlapping area between the orthographic projection of the eighth conductive connection portion L8 on the substrate and the orthographic projection of the second clock signal line CK on the substrate. As shown in FIG. 7, the eighth conductive connection portion L8 is coupled to the second clock signal line CK through the ninth via hole H9 provided in the ninth overlapping area.

Since the gate electrode of T3 is coupled to the second clock signal line CK, the gate electrode of T3 can be set close to the second clock signal line CK for reasonable layout.

Specifically, as shown in FIGS. 1 and 3, the display substrate may include a first clock signal line CB and a third voltage signal line VGL2; the first clock signal line CB and the third voltage signal line VGL2 Extend in the first direction. The second clock signal line CK is disposed between the first clock signal line CB and the third voltage signal line VGL2.

Optionally, the first clock signal line may also be arranged between the second clock signal line and the third voltage signal line.

In specific implementation, as shown in FIG. 1 and FIG. 3, the at least one shift register unit may further include an input transistor T1. As shown in FIG. 5, a gate electrode G1 of the input transistor T1 is coupled to the seventh conductive connection portion L7; as shown in FIG. 3, a first electrode S1 of the input transistor T1 is coupled to the input signal end E1. A second electrode D1 of the input transistor T1 is coupled to a ninth conductive connection portion L9, and the orthographic projection of the ninth conductive connection portion L9 on the substrate and the orthographic projection of the second electrode plate C2b of the second capacitor C2 on the substrate have a tenth overlapping area, and the ninth conductive connection portion L9 is coupled to the second electrode plate C2b of the second capacitor C2 through the tenth via hole H10 provided in the tenth overlapping area.

As shown in FIGS. 3, 4, 6, 7 and 8, the first electrode S1 of the input transistor T1 is coupled to the input conductive connection portion L70 through a ninth connection via hole H89, and the input conductive connection portion L70 is coupled to the input signal end E1 through the tenth connection via hole H810, so that the first electrode S1 of the input transistor T1 is coupled to the input signal end E1.

As shown in FIGS. 3, 4, 6, 7 and 8, the second electrode D1 of the input transistor T1 is coupled to a ninth conductive connection portion L9, and the ninth conductive connection portion L9 is coupled to the second electrode plate C2b of the second capacitor C2 through the tenth via hole H10 provided in the tenth overlapping area, so that the second electrode D1 of the input transistor T1 is coupled to the second electrode plate C2b of the second capacitor C2.

In at least one embodiment of the present disclosure, the ninth conductive connection portion L9 may extend along the first direction to reduce the lateral width of the shift register unit.

In at least one embodiment of the present disclosure, as shown in FIGS. 1 and 3, the at least one shift register unit may further include a third node control transistor T4. As shown in FIG. 5, a gate electrode G4 of the third node control transistor T4 is coupled to the tenth conductive connection portion L10. As shown in FIGS. 3 and 7, there is an eleventh overlapping area between the orthographic projection of the tenth conductive connection portion L10 on the substrate and the orthographic projection of the first clock signal line CB on the substrate, so that the tenth conductive connection portion L10 is coupled to the first clock signal line CB through an eleventh via hole H11 provided in the eleventh overlapping area.

Optionally, the tenth conductive connection portion L10 may be arranged along the second direction, but it is not limited to this.

Specifically, as shown in FIGS. 1 and 3, the shift register includes a second transistor T7. As shown in FIG. 5, the gate electrode G4 of the third node control transistor T4 is coupled to the gate electrode G7 of the second transistor T7.

Since the gate electrode G4 of T4 and the gate electrode G7 of T7 need to be coupled to each other, during the layout process, T4 and T7 can be set close to each other.

In at least one embodiment of the present disclosure, as shown in FIGS. 1 and 3, the at least one shift register unit may include a second capacitor connection transistor T5. As shown in FIG. 4, the active layer of the input transistor T1, the active layer of the third node control transistor T4, and the active layer of the second capacitor connection transistor T5 may be formed by a continuous third semiconductor layer 30.

The active layer of the input transistor T1 includes a first one of fifth conductive portions 311, a fifth channel portion 32, and a second one of fifth conductive portions 312 sequentially arranged along the first direction. The second fifth conductive portion 312 is reused as a first one of sixth conductive portions.

The active layer of the third node control transistor T4 includes a first one of sixth conductive portions, a sixth channel portion 34, and a second one of sixth conductive portions 332 sequentially arranged along the first direction. The second sixth conductive portion 332 is reused as a first one of seventh conductive portions.

The active layer of the second capacitor connection transistor T5 includes a first one of seventh conductive portions, a seventh channel portion 36 and a second one of seventh conductive portions 352 that are sequentially arranged along the first direction.

In at least one embodiment of the present disclosure, as shown in FIGS. 3 and 4, the first one of fifth conductive portions 311 is used as the first electrode S1 of the input transistor T1, and the second one of fifth conductive portions 312 is used as the second electrode D1 of the input transistor T1, the second one of sixth conductive portions is used as the first electrode S4 of the third node control transistor T4, and the second one of seventh conductive portions is used as the first electrode S5 of the second capacitor connection transistor T5.

And, as shown in FIG. 3, the second electrode D1 of the input transistor T1 is reused as the second electrode D4 of the third node control transistor T4, and the first electrode S4 of the third node control transistor T4 is reused as the second electrode the second electrode D5 of the second capacitor connection transistor T5. That is, in the display substrate according to at least one embodiment of the present disclosure, in the input transistor T1, the third node control transistor T4, and the second capacitor connection transistor T5, adjacent transistors can be coupled directly to each other through the conductive portions included in the third semiconductor layer 30, which reduces the area occupied by T1, T4, and T5 in the first direction.

Specifically, the scan driving circuit may further include a third voltage signal line. The third voltage signal line extends along the first direction. The orthographic projection of the third voltage signal line on the substrate, the orthographic projection of the first clock signal line on the substrate, and the orthographic projection of the second clock signal line on the substrate are all located at a side of the orthographic projection of the shift register unit on the substrate away from the display area of the display substrate. The signal output line extends along a second direction, and the first direction intersects the second direction.

Specifically, the specific positions of the first clock signal line, the second clock signal line, and the third voltage signal line can be set according to actual needs. For example, the first clock signal line, the second clock signal line and the third voltage signal line are all arranged at the edge of the display substrate, that is, the orthographic projection of the third voltage signal line on the substrate, the orthographic projection of the first clock signal line on the substrate and the orthographic projection of the second clock signal line on the substrate are all located at a side the orthographic projection of the shift register unit on the substrate away from the display area of the display substrate. When the shift register unit is laid out, it is possible to prevent the transistors in the shift register unit from interacting with the first clock signal line, the second clock signal line, and the third voltage signal line too much, which is more conducive to improve the working performance of the shift register unit.

In addition, the first clock signal line, the second clock signal line, and the third voltage signal line are arranged to extend along the first direction, it is more advantageous for the display substrate to achieve a narrow frame.

In specific implementation, the phases of the first clock signal outputted by the first clock signal line is inverse to the phase of the second clock signal outputted by the second clock signal line, but not limited herein.

In a specific implementation, as shown in FIGS. 1 and 3, the scan driving circuit may include a first voltage signal line VGH, a second voltage signal line VGL1, a third voltage signal line VGL2, a first clock signal line CB, a second clock signal line CK and a signal output line EOUT. The at least one shift register unit may further include an output capacitor C3, a first capacitor C1, a second capacitor C2, an output reset transistor T9, an output transistor T10, a first transistor T8, a second transistor T7, a first capacitor connection transistor T6, a second capacitor connection transistor T5, a first node control transistor T2, a second node control transistor T3, an input transistor T1, and a third node control transistor T4.

The output reset transistor T9 and the output transistor T10 are arranged along a first direction.

The first electrode S9 of the output reset transistor T9 is coupled to the first voltage signal line VGH, and the first electrode S10 of the output transistor T10 is coupled to the second voltage signal line VGL1.

The output transistor T10 and the signal output line EOUT are arranged along a first direction, and the second electrode D9 of the output reset transistor T9 and the second electrode D10 of the output transistor T10 are both coupled to the signal output line EOUT.

The signal output line EOUT extends along a second direction, and the first direction intersects the second direction.

The second electrode D8 of the first transistor T8 is coupled to the second electrode plate C3b of the output capacitor C3, the first electrode S8 of the first transistor T8 is coupled to the first voltage signal line VGH, the gate electrode G8 of the first transistor T8 is coupled to the second electrode D4 of the third node control transistor T4.

The second electrode D7 of the second transistor T7 is coupled to the first electrode plate C1a of the first capacitor C1, and the first electrode S7 of the second transistor T7 is coupled to the second electrode plate C3b of the output capacitor C3, the gate electrode G7 of the second transistor T7 is coupled to the gate electrode G4 of the third node control transistor T4.

The gate electrode G6 of the first capacitor connection transistor T6 and the gate electrode G5 of the second capacitor connection transistor T5 are respectively coupled to the second electrode plate C1b of the first capacitor C1; the second electrode D6 of the first capacitor connection transistor T6 is coupled to the first electrode plate C1a of the first capacitor C1; the first electrode S6 of the first capacitor connection transistor T6 is coupled to the gate electrode G7 of the second transistor T7.

The first electrode S5 of the second capacitor connection transistor T5 is coupled to the first voltage signal line VGH; the gate electrode G5 of the second capacitor connection transistor T5 is coupled to the second electrode D3 of the second node control transistor T3; the second electrode D5 of the second capacitor connection transistor T5 is coupled to the first electrode S4 of the third node control transistor T4.

The first electrode S2 of the first node control transistor T2 is coupled to the gate electrode G3 of the second node control transistor T3; the gate electrode G2 of the first node control transistor T2 is coupled to the second electrode plate C2b of the second capacitor C2.

The second electrode D3 of the second node control transistor T3 is coupled to the second electrode D2 of the first node control transistor T2; the gate electrode G3 of the second node control transistor T3 is coupled to the second clock signal line CK; the first electrode S3 of the second node control transistor T3 is coupled to the third voltage signal line VGL2.

The gate electrode G1 of the input transistor T1 is coupled to the gate electrode G3 of the second node control transistor T3; the first electrode S1 of the input transistor T1 is coupled to the input signal end E1; the second electrode D1 of the input transistor T1 is coupled to the second electrode plate C2b of the second capacitor C2.

The gate electrode G4 of the third node control transistor T4 is coupled to the first clock signal line CB.

The first electrode plate C3a of the output capacitor C3 is coupled to the first voltage signal line VGH, and the second electrode plate C3b of the output capacitor C3 is coupled to the gate electrode G9 of the output reset transistor T9.

The second electrode plate C2b of the second capacitor C2 is coupled to the gate electrode G10 of the output transistor T10, and the first electrode plate C2a of the second capacitor C2 is coupled to the first clock signal line CB.

The second electrode D9 of the output reset transistor T9 and the second electrode D10 of the output transistor T10 are both coupled to the signal output line EOUT.

In at least one embodiment of the present disclosure, the first clock signal line, the second clock signal line, and the third voltage signal line are arranged in sequence along the direction close to the display area; or the second clock signal line, the first clock signal line, and the third voltage signal line are arranged in sequence along the direction close to the display area.

As shown in FIG. 9, based on FIG. 6, the first electrode plate C1a of the first capacitor C1 may include a first horizontal plate portion C1a1 and a first vertical plate portion C1a2.

As shown in FIG. 3, the output reset transistor T9 and the output transistor T10 are arranged between the first voltage signal line VGH and the second voltage signal line VGL1; the output reset transistor T9, the output transistor T10 and the signal output line EOUT are arranged in sequence along the first direction.

The third voltage signal line VGL2 is arranged on a side of the first voltage signal line VGH away from the second voltage signal line VGL1; the first capacitor C1, the first transistor T8, the second transistor T7, the first capacitor connection transistor T6, the second capacitor connection transistor T5, the first node control transistor T2, the second node control transistor T3, the input transistor T1 and the third node control transistor T4 are all arranged between the first voltage signal line VGH and the third voltage signal lines VGL2.

The first transistor T8, the second transistor T7, and the first vertical plate portion C1a2 are sequentially arranged along a first direction, the input transistor T1, the third node control transistor T4, and the second capacitor connection transistors T5 and the first horizontal plate portion C1a1 are sequentially arranged along the first direction, and the second node control transistor T3 and the first node control transistor T2 are sequentially arranged along the first direction.

The orthographic projection of the gate electrode G6 of the first capacitor connection transistor T6 on the substrate is arranged between the orthographic projection of the second electrode plate C1b of the first capacitor C1 on the substrate and the orthographic projections of first voltage signal line VGH on the substrate.

The orthographic projection of the gate electrode G7 of the second transistor T7 on the substrate is arranged between the orthographic projection of the gate electrode G4 of the third node control transistor T4 on the substrate and the orthographic projection of the first voltage signal line VGH on the substrate.

The orthographic projection of the gate electrode G2 of the first node control transistor T2 on the substrate is arranged between the orthographic projection of the third voltage signal line VGL2 on the substrate and the orthographic projection of the first electrode plate C1a of the first capacitor C1 on the substrate.

The minimum distance in the second direction between the orthographic projection of the gate electrode G2 of the first node control transistor T2 on the substrate and the orthographic projection of the third voltage signal line VGL2 on the substrate is greater than the minimum distance in the second direction between the orthographic projection of the gate electrode G5 of the second capacitor connection transistor T5 on the substrate and the orthographic projection of the third voltage signal line VGL2 on the substrate.

In the layout shown in FIG. 3 of the present disclosure, since the output reset transistor T9 is coupled to the first voltage signal line VGH, and the output transistor T10 is coupled to the second voltage signal line VGL1, the output reset transistor T9 and the output transistor T10 are arranged between the first voltage signal line VGH and the second voltage signal line VGL1, and the space between the T10 included in the nth stage of shift register unit and the output reset transistor included in the (n+1)th stage of shift register unit is fully used to set the signal output line EOUT, so that T9 and T10 are set between VGH and VGL1, and no other signals and other components included in transistors are provided between the first voltage signal line VGH and the output circuit (the output circuit includes T9 and T10), no other signal lines and components included in other transistors are provided between the second voltage signal line VGL1 and the output circuit (the output circuit includes T9 and T10), thereby reducing the distance from VGH to T9 and T10 and the distance from VGL1 to T9 and T10, and reducing the lateral width of the shift register unit.

In the layout shown in FIG. 3 of the present disclosure, T8 is moved to the left side of the first voltage signal line VGH, and the orthographic projection of the electrode plate of the output capacitor C3 on the substrate partially overlaps the orthographic projection of the first voltage signal line VGH on the substrate, so as to reduce the distance between the first electrode S8 of the first transistor T8 and the first voltage signal line VGH, and reduce the distance between the second electrode D8 of the first transistor T8 and the second electrode plate C2b of the output capacitor C3, so that T8 is easily coupled to the first voltage signal line VGH and the second electrode plate C3b of the output capacitor C3, so that the space is compact and the layout is more reasonable.

In the layout shown in FIG. 3 of the present disclosure, T5 and T6 are set to be close to each other to adjust the shape of the electrode plate of C1, and the first electrode plate C1a of C1 is set to an L shape, which makes full use of the wiring space between the gate electrode of T5 and the second conductive connection portion, makes the layout more reasonable, effectively reduces the horizontal width of the shift register unit, and reduces the vertical height of the shift register unit.

In at least one embodiment of the present disclosure, the minimum distance in the second direction between the orthographic projection of the gate electrode G2 of the first node control transistor T2 on the substrate and the orthographic projection of the third voltage signal line VGL2 on the substrate refers to the minimum distance in the second direction between any point on the edge line of the orthographic projection of G2 on the substrate and the edge line of the orthographic projection of VGL2 on the substrate.

The minimum distance in the second direction between the orthographic projection of the gate electrode G5 of the second capacitor connection transistor T5 on the substrate and the orthographic projection of the third voltage signal line VGL2 on the substrate refers to: the minimum distance in the second direction between any point on the edge line of the orthographic projection of G5 on the substrate and the edge line of the orthographic projection of VGL2 on the substrate.

In a specific implementation, the orthographic projection of the first electrode plate C3a of the output capacitor C3 on the substrate and the orthographic projection of the first voltage signal line VGH on the substrate have a signal line overlapping area; the orthographic projection of the second electrode plate C3b of the output capacitor C3 on the substrate partially overlaps the orthographic projection of the first voltage signal line VGH on the substrate.

The orthographic projection of the first electrode plate C2a of the second capacitor C2 on the substrate is within the orthographic projection of the second electrode plate C2b of the second capacitor C2 on the substrate; the first electrode plate C2a of the second capacitor C2 is an L shape.

As shown in FIG. 9, the first electrode plate C2a of the second capacitor C2 includes a second horizontal plate portion C2a1 and a second vertical plate portion C2a2. The gate electrode G2 of the first node control transistor T2 and the second horizontal plate portion C2a1 are arranged along a first direction. The orthographic projection of the second vertical plate portion C2a2 on the substrate partially overlaps the orthographic projection of the third voltage signal line VGL2 on the substrate.

In the layout shown in FIG. 3 of the present disclosure, the electrode plate of C2 is set to an L shape, and the space between T2 in the nth stage of shift register unit and the second node in the (n+1)th stage of shift register unit are used to arrange the horizontal plate portion in the electrode plate of C2, thereby reducing the lateral width of the shift register unit.

In at least one embodiment of the present disclosure, a first gate insulating layer may be provided between the semiconductor layer shown in FIG. 4 and the first gate metal layer shown in FIG. 5; a second gate insulating layer may also be provided between the first gate metal layer as shown in FIG. 5 and the second gate metal layer shown in FIG. 6; an insulating layer may also be included between the second gate metal layer shown in FIG. 6 and the source-drain metal layer as shown in FIG. 8.

When manufacturing the display substrate described in at least one embodiment of the present disclosure, a semiconductor material layer is first provided on the substrate, and the semiconductor material layer is patterned to form the active layer of each transistor; as shown in FIG. 4, the first semiconductor layer 10, the second semiconductor layer 20, and the third semiconductor layer 30 are formed. The first capacitor connection transistor T6 includes a first active pattern A1, a second active pattern A2 of the first node control transistor T2, and the second node control transistor T3 includes a third active pattern A3.

A first gate insulating layer is formed on the side of the active layer away from the substrate.

A first gate metal layer is formed on the side of the first gate insulating layer away from the active layer, and the first gate metal layer is patterned to form the gate electrode of each transistor included in the shift register unit, the second electrode plate of the output capacitor C3, the second electrode plate of the first capacitor C1, and the second electrode plate of the second capacitor C2, as shown in FIG. 5.

The portion of the active layer that is not covered by the gate electrode is doped by using the gate electrodes of transistors as a mask, so that a portion of the active layer that is not covered by the gate electrodes is formed as a conductive portion, a portion of the active layer that is covered by the gate electrodes is formed as a channel portion; the conductive portion is used as a first electrode or a second electrode; or the conductive portion is coupled to the first electrode or the second electrode.

A second gate insulating layer is formed on the side of the first gate metal layer away from the first gate insulating layer.

A second gate metal layer is formed on the side of the second gate insulating layer facing away from the first gate metal layer, and the second gate metal layer is patterned to form the signal output line EOUT, the input signal end R1, the first electrode plate of the output capacitor C3, the first electrode plate of the first capacitor C1 and the first electrode plate of the second capacitor C2, as shown in FIG. 6.

An insulating layer is formed on the side of the second gate metal layer away from the second gate insulating layer;

As shown in FIG. 7, a plurality of via holes are formed on the substrate provided with the active layer, the first gate insulating layer, the first gate metal layer, the second gate insulating layer, the second gate metal layer and the insulating layer.

A source-drain metal layer is formed on the side of the insulating layer away from the second gate metal layer, and the source-drain metal layer is patterned to form the first voltage signal line VGH, the second voltage signal line VGL1, the third voltage signal line VGL2, the first clock signal line CB, the second clock signal line CB, the start signal line ESTV, the second electrode of the output reset transistor T9, the first electrode S9 of the output reset transistor T9, the second electrode D10 of the output transistor T10, and a first electrode S10 of the output transistor T10, as shown in FIG. 8.

The method for manufacturing a display substrate according to at least one embodiment of the present disclosure includes forming a scan driving circuit on a substrate, and forming at least one driving transistor in a display area included in the display substrate; the driving transistor is configured to drive a light emitting element for display.

The scan driving circuit includes a plurality of shift register units, a first voltage signal line, a second voltage signal line, a first clock signal line, and a second clock signal line. At least one of the plurality of shift register units include a signal output line, a first capacitor, and at least two transistors coupled to the same electrode plate of the first capacitor; the gate electrodes of the at least two transistors are respectively coupled to the same electrode plate of the first capacitor.

The method of manufacturing the display substrate further includes: forming the first capacitor and the at least two transistors on the same side of the first voltage signal line.

The first voltage signal line, the second voltage signal line, the first clock signal line, and the second clock signal line are arranged to extend along the first direction, and the signal output line is arranged to extend along the second direction. The first direction intersects the second direction.

In at least one embodiment of the present disclosure, the electrode plate of the first capacitor coupled to the at least two transistors may be the second electrode plate of the first capacitor.

In at least one embodiment of the present disclosure, since the transistor coupled to the second electrode plate of the first capacitor is also coupled to the first voltage signal line, the first capacitor and the at least two transistors are both arranged on the same side of the first voltage signal line for reasonable layout.

In at least one embodiment of the present disclosure, the maximum distance in the second direction between the orthographic projection of the gate electrodes of the at least two transistors on the substrate and the orthographic projection of the first voltage signal line on the substrate may be less than the first predetermined distance.

Optionally, the first predetermined distance may be greater than or equal to 30 microns and less than or equal to 40 microns.

In specific implementation, since the transistor coupled to the second electrode plate of the first capacitor is also coupled to the first voltage signal line, the position of the transistor coupled to the second electrode plate of the first capacitor is better to be close to the first voltage signal line. The maximum distance in the second direction between the orthographic projection of the gate electrode the transistor coupled to the second electrode plate of the first capacitor on the substrate and the orthographic projection of the first voltage signal line on the substrate is set to be smaller than the first predetermined distance, so as to reduce the lateral width of the shift register unit.

In a specific implementation, the at least two transistors include a first capacitor connection transistor and a second capacitor connection transistor.

The specific steps of manufacturing the first capacitor connection transistor and the second capacitor connection transistor include: forming an active layer of the first capacitor connection transistor and an active layer of the second capacitor connection transistor on the substrate; forming a first gate metal layer on the side of the active layer away from the substrate, and performing a patterning process on the first gate metal layer to form the gate electrode the first capacitor connection transistor, the gate electrode of the second capacitor connection transistor and the second electrode plate of the first capacitor, and the gate electrode of the first capacitor connection transistor and the gate electrode the second capacitor connection transistor are coupled to the second electrode plate of the first capacitor; doping the portion of the active layer that is not covered by the gate electrode of the first capacitor connection transistor and the gate electrode of the second capacitor connection transistor by using the gate electrodes as a mask, so that the portion of the active layer that is not covered by the gate electrodes is formed as a conductive portion, and the portion of the active layer that is covered by the gate electrodes is formed as a channel portion; the active layer of the first capacitor connection transistor includes the first one of first capacitor connection conductive portions, the first capacitor connection channel portion, and the second one of first capacitor connection conductive portions arranged in sequence along the first direction; the active layer of the second capacitor connection transistor includes the first one of seventh conductive portions, the seventh channel portion and the second one of seventh conductive portions arranged sequentially along the first direction; the first one of first capacitor connection conductive portions is used as the first electrode of the first capacitor connection transistor, the second one of first capacitor connection conductive portions is used as the second electrode of the first capacitor connection transistor; forming a second gate metal layer on the side of the first gate metal layer away from the active layer, and performing a patterning process on the second gate metal layer to form a first electrode plate of the first capacitor; forming a source-drain metal layer on the side of the second gate metal layer away from the first gate metal layer, and performing a patterning process on the source-drain metal layer to form the first voltage signal line, the second voltage signal line and the first conductive connection portion.

There is a first overlapping area between the orthographic projection of the first conductive connection portion on the substrate and the orthographic projection of the first electrode plate of the first capacitor on the substrate, and the first conductive connection portion is coupled to the first electrode plate of the first capacitor through at least one first via hole provided in the first overlapping area.

In at least one embodiment of the present disclosure, the first one of seventh conductive portion may be used as the second electrode of the second capacitor connection transistor, and the second one of seventh conductive portions may be used as the first electrode of the second capacitor connection transistor, and the first electrode of the second capacitor connection transistor is coupled to the first voltage signal line.

A distance in the second direction between the orthographic projection of the gate electrode of the first capacitor connection transistor on the substrate and the orthographic projection of the first voltage signal line on the substrate is smaller than a distance in the second direction between the orthographic projection of the gate electrode the second capacitor connection on the substrate and the orthographic projection of the first voltage signal line on the substrate.

In specific implementation, the distance in the second direction between the orthographic projection of the gate electrode the first capacitor connection transistor on the substrate and the orthographic projection of the first voltage signal line on the substrate is smaller than the distance in the second direction between the orthographic projection of the gate electrode of the second capacitor connection transistor on the substrate and the orthographic projection of the first voltage signal line on the substrate, that is, the second capacitor connection transistor is arranged on a side of the first capacitor connection transistor away from the first voltage signal line.

The maximum distance in the second direction between the gate electrode of the first capacitor connection transistor and the gate electrode of the second capacitor connection transistor is less than the second predetermined distance.

The orthographic projection of the first electrode plate of the first capacitor on the substrate is within the orthographic projection of the second electrode plate of the first capacitor on the substrate. The first electrode plate of the first capacitor is of an L shape.

In at least one embodiment of the present disclosure, the first capacitor connection transistor and the second capacitor connection transistor are set to be relatively close to each other to adjust the shape of the electrode plate of the first capacitor, and the first electrode plate of the first capacitor is set to be the L shape to fully use the wiring space between the gate electrode of the second capacitor connection transistor and the second conductive connection portion, so that the layout is more reasonable, the lateral width of the shift register unit is effectively reduced, and the vertical height of the shift register is reduced.

Optionally, the at least one shift register unit may further include a first node control transistor and a second capacitor.

The step of manufacturing the first node control transistor and the second capacitor may include: forming the active layer of the first node control transistor on the substrate while forming the active layer of the first capacitor connection transistor and the active layer of the second capacitor connection transistor on the substrate; performing a patterning process on the first gate metal layer to form the gate electrode of the first node control transistor and the second electrode plate of the second capacitor, and the gate electrode of the first node control transistor being coupled to the second electrode plate of the second capacitor; doping the portion of the active layer of the first node control transistor that is not covered by the gate electrode of the first node control transistor using the gate electrode of the first node control transistor as a mask; patterning the second gate metal layer to form the first electrode plate of the second capacitor, and the orthographic projection of the first electrode plate of the second capacitor on the substrate being within the orthographic projection of the second electrode plate of the second capacitor on the substrate; the first electrode plate of the second capacitor is of an L shape; the first electrode plate of the second capacitor including a second horizontal plate portion; the orthographic projection of the gate electrode of the first node control transistor on the substrate and the orthographic projections of the second horizontal plate portion on the substrate being arranged along the first direction.

In at least one embodiment of the present disclosure, the first electrode plate of the second capacitor is set in an L shape, and the space between the first node control transistor and the adjacent next stage of shift register unit is used to place the horizontal electrode plate portion included in the first electrode plate of the second capacitor, so as to reduce the lateral width of the shift register unit.

Optionally, the method of manufacturing the display substrate described in at least one embodiment of the present disclosure may further include: performing a patterning process on the source-drain metal layer to form a third voltage signal line extending along the first direction.

The first node control transistor is located on a side of the second capacitor connection transistor away from the first voltage signal line; the first node control transistor is located between the third voltage signal line and the first voltage signal line.

The first electrode plate of the second capacitor further includes a second vertical plate portion coupled to the second horizontal plate portion; the orthographic projection of the second vertical plate portion on the substrate partially overlaps the orthographic projection of the third voltage signal line on the substrate.

Specifically, the first electrode plate of the second capacitor is set in an L shape, and the orthographic projection of the second vertical plate portion of the second capacitor on the substrate partially overlaps the orthographic projection of the third voltage signal line on the substrate, so as to reduce the vertical height of the shift register unit.

In specific implementation, the method of manufacturing the display substrate further includes forming a second voltage signal line on the substrate; the at least one shift register unit may further include an output circuit.

The method of manufacturing the display substrate further includes: forming a transistor included in the output circuit between the first voltage signal line and the second voltage signal line.

In the method of manufacturing the display substrate according to at least one embodiment of the present disclosure, the output circuit is arranged between the first voltage signal line and the second voltage signal line, so that in the spatial structure, the first voltage signal line is arranged at a side of the output circuit away from the display area, and no other signal lines and components included in other transistors are arranged between the first voltage signal line and the output circuit, and the second voltage signal line is arranged at a side of the output circuit close to the display area, no other signal lines and components included in other transistors are provided between the second voltage signal line and the output circuit, which can reduce the distance between the first voltage signal line and the output circuit, and reduce the distance between the second voltage signal line to the output circuit, reduce the lateral width of the shift register unit.

In at least one embodiment of the present disclosure, the first voltage signal line and the second voltage signal line may extend along a first direction.

Optionally, the output circuit may include an output transistor and an output reset transistor, and the step of manufacturing the transistor included in the output circuit specifically includes: forming a first semiconductor layer extending along a first direction between the first voltage signal line and the second voltage signal line; forming a first gate metal layer at a side of the first semiconductor layer away from the substrate, and performing a patterning process on the first gate metal layer to form the gate electrode of the output transistor and gate electrode of the output reset transistor; doping a portion of the first semiconductor layer that is not covered by the gate electrode of the output transistor and the gate electrode the output reset transistor by using the gate electrodes as a mask, so that a portion of the first semiconductor layer that is not covered by the gate electrodes is formed as a conductive portion, and the portion of the first semiconductor layer that is covered by the gate electrodes is formed as a channel portion.

In specific implementation, the active layer of the output transistor and the active layer of the output reset transistor may be formed by a continuous first semiconductor layer, but it is not limited to this.

In at least one embodiment of the present disclosure, the active layer of the output transistor and the active layer of the output reset transistor may be formed by a continuous first semiconductor layer; the active layer of the output reset transistor includes at least one first conductive portion and at least one first channel portion arranged oppositely in the first direction; each of the first channel portions is arranged between two adjacent first conductive portions; the active layer of the output transistor may include at least two second conductive portions and at least one second channel portion arranged opposite to each other along the first direction; each of the second channel portions is arranged between two adjacent second conductive portions; the first conductive portion of the active layer of the output reset transistor that is closest to the active layer of the output transistor can be reused as the second conductive portion of the output transistor, which can further reduce the layout space of the output transistor and the output reset transistor, and is beneficial to realize the narrow frame of the display substrate.

In a specific implementation, the method of manufacturing the display substrate may further include: forming a second gate metal layer on a side of the first gate metal layer away from the first semiconductor layer; performing a patterning process on the second gate metal layer to form a signal output line extending in the second direction. The orthographic projection of the first semiconductor layer on the substrate and the orthographic projection of the signal output line on the substrate are arranged along a first direction, and the first direction intersects the second direction.

In at least one embodiment of the present disclosure, the orthographic projection of the first semiconductor layer on the substrate and the orthographic projection of the signal output line on the substrate are arranged along the first direction, which can reduce the horizontal width of the shift register unit.

In at least one embodiment of the present disclosure, the steps of forming the first voltage signal line and the second voltage signal line may specifically include: forming a source-drain metal layer at the side of the second gate metal layer away from the first gate metal layer, and performing a patterning process on the source-drain metal layer to form the first voltage signal line and the second Voltage signal line.

Optionally, the at least one shift register unit may further include an output capacitor and a first transistor; the method of manufacturing the display substrate may further include: forming the output capacitor, and forming a first transistor on the side of the first voltage signal line away from the second voltage signal line, so that the first electrode of the first transistor is coupled to the first voltage signal line, the second electrode of the first transistor is coupled to a electrode plate of the output capacitor.

The maximum distance in the second direction between the orthographic projection of the first electrode of the first transistor on the substrate and the orthographic projection of the first voltage signal line on the substrate is less than the third predetermined distance, the maximum distance in the second direction between the orthographic projection of the second electrode of the first transistor on the substrate and the orthographic projection of the electrode plate of the output capacitor on the substrate is less than a fourth predetermined distance.

In at least one embodiment of the present disclosure, since the first electrode of the first transistor is coupled to the first voltage signal line, and the second electrode of the first transistor is coupled to the second electrode plate of the output capacitor, when manufacturing the display substrate, the closer the first transistor is to the first voltage signal line and the output capacitor, the more reasonable the corresponding layout will be. In at least one embodiment of the present disclosure, the first transistor is arranged on the side of the first voltage signal line away from the second voltage signal line, and the maximum distance in the second direction between the orthographic projection of the first electrode of the first transistor on the substrate and the orthographic projection of the first voltage signal line on the substrate is set to be less than the third predetermined distance, and the maximum distance in the second direction between the orthographic projection of the second electrode of the first transistor on the substrate and the orthographic projection of the electrode plate of the output capacitor on the substrate is smaller than the fourth predetermined distance, so as to make a reasonable layout.

Optionally, the at least one shift register unit may further include a second transistor, and the step of forming the first transistor and the second transistor specifically includes: forming a second semiconductor layer extending in the first direction on the side of the first voltage signal line away from the second voltage signal line; forming a first gate metal layer at the side of the second semiconductor layer away from the substrate, and performing a patterning process on the first gate metal layer to form the gate electrode of the first transistor and the gate electrode of the second transistor; doping the portion of the second semiconductor layer that is not covered by the gate electrode of the first transistor and the gate electrode of the second transistor by using the gate electrodes as a mask, so that the portion of the second semiconductor layer that is not covered by the gate electrodes is formed as a conductive portion, and the portion of the second semiconductor layer that is covered by the gate electrodes is formed as a channel portion. The second semiconductor layer includes a first one of third conductive portions, a third channel portion, a second one of third conductive portions, a fourth channel portion, and a second of fourth conductive portions that are sequentially arranged along the first direction. The second one of third conductive portions is reused as the first one of fourth conductive portions. The first one of third conductive portions is used as the first electrode of the first transistor, the second one of third conductive portions is used as the second electrode of the first transistor; the second one of fourth conductive portions is used as the second electrode of the second transistor.

In a specific implementation, the electrode plate of the output capacitor coupled to the second electrode of the first transistor may be the second electrode plate of the output capacitor; the specific steps of forming the output capacitor include: performing a patterning process on the first gate metal layer to form a second electrode plate of the output capacitor; forming a second gate metal layer on the side of the first gate metal layer away from the second semiconductor layer, and performing a patterning process on the second gate metal layer to form a first electrode plate of the output capacitor; forming a source-drain metal layer on the side of the second gate metal layer away from the first gate metal layer, and performing a patterning process on the source-drain metal layer to form a conductive connection portion of the electrode plate, the first voltage signal line and the second voltage signal line.

The orthographic projection of the first electrode plate of the output capacitor on the substrate and the orthographic projection of the first voltage signal line on the substrate have a signal line overlapping area, and the first electrode plate of the output capacitor is coupled to the first voltage signal line through at least one signal line via hole provided in the signal line overlapping area.

The orthographic projection of the conductive connection portion of the electrode plate on the substrate and the orthographic projection of the second electrode plate of the output capacitor on the substrate have has an electrode plate overlapping area, and the conductive connection portion of the electrode plate is coupled to the second electrode plate of the output capacitor through at least one electrode plate via hole provided in the electrode plate overlapping area.

In at least one embodiment of the present disclosure, the active layer of the first transistor and the active layer of the second transistor may be formed by a continuous second semiconductor layer; the second semiconductor layer extends along the first direction. The active layer of the first transistor includes a first one of third conductive portions, a third channel portion, and a second one of third conductive portions sequentially arranged along the first direction; the second one of third conductive portions is reused as the first one of fourth conductive portions. The active layer of the second transistor includes the first one of fourth conductive portions, the fourth channel portion, and the second one of fourth conductive portions sequentially arranged along the first direction; the first one of third conductive portions is used as the first electrode of the first transistor, the second one of third conductive portions is used as the second electrode of the first transistor; the second one of fourth conductive portions is used as the second electrode of the second transistor. In at least one embodiment of the present disclosure, the second transistor is arranged between the first transistor and the first capacitor, and the second electrode of the first transistor is reused as the second electrode of the second transistor to reduce the vertical height of the shift register unit while reducing the horizontal width of the shift register unit.

The display device according to at least one embodiment of the present disclosure includes the above-mentioned display substrate.

Since the display substrate provided by the foregoing embodiment can realize a narrow frame, the display device provided by at least one embodiment of the present disclosure can also achieve the beneficial effect of having a narrow frame when the display device provided by at least one embodiment of the present disclosure includes the foregoing display substrate, which will not be repeated herein.

The display device provided by at least one embodiment of the present disclosure may be any product or component with a display function, such as a mobile phone, a tablet computer, a television, a monitor, a notebook computer, a digital photo frame, a navigator, and the like.

Unless otherwise defined, the technical terms or scientific terms used in the present disclosure shall have the usual meanings understood by those with ordinary skills in the art. The "first", "second" and similar words used in the present disclosure do not indicate any order, quantity or importance, but are only used to distinguish different components. "Include" or "comprise" and other similar words mean that the element or item appearing before the word covers the element or item listed after the word and their equivalents, but does not exclude other elements or items Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, region or substrate is referred to as being "above" or "under" another element, the element can be "directly" above or under the other element. Or there may be intermediate elements.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a scan driving circuit and a display area arranged on a substrate, wherein the scan driving circuit includes a plurality of shift register units; the scan driving circuit further includes a first voltage signal line, a second voltage signal line, a first clock signal line, and a second clock signal line; the first voltage signal line, the second voltage signal line, the first clock signal line, and the second clock signal line extend along a first direction; the display area includes at least one driving transistor configured to drive a light emitting element for display;
   at least one shift register unit of the plurality of shift register units includes a signal output line, a first capacitor, and at least two transistors coupled to a same electrode plate of the first capacitor; the signal output line extends along a second direction, the first direction intersects the second direction;
   gate electrodes of the at least two transistors are respectively coupled to the same electrode plate of the first capacitor, and both the first capacitor and the at least two transistors are arranged on a same side of the first voltage signal line,
   wherein a maximum distance in the second direction between an orthographic projection of the gate electrodes of the at least two transistors on the substrate and an orthographic projection of the first voltage signal line on the substrate is less than a first predetermined distance.

2. The display substrate according to claim 1, wherein the first predetermined distance is greater than or equal to 30 microns and less than or equal to 40 microns.

3. The display substrate according to claim 1, wherein the at least two transistors comprise a first capacitor connection transistor and a second capacitor connection transistor;
   a gate electrode of the first capacitor connection transistor and a gate electrode of the second capacitor connection transistor are respectively coupled to a second electrode plate of the first capacitor;
   the at least one shift register unit further includes a first conductive connection portion coupled to the second electrode of the first capacitor connection transistor, and an orthographic projection of the first conductive connection portion on the substrate and an orthographic projections of a first electrode plate of the first capacitor on the substrate have a first overlapping area, and the first conductive connection portion is coupled to the first electrode plate of the first capacitor through at least one first via hole provided in the first overlapping area.

4. The display substrate according to claim 3, wherein the at least one shift register unit includes a second transistor;
   the at least one shift register unit further includes a gate connection conductive portion coupled to a gate electrode of the second transistor, and a first electrode connection conductive portion coupled to a first electrode of the first capacitor connection transistor;
   the gate connection conductive portion and the first electrode connecting conductive portion have a connection overlapping area;
   the gate connection conductive portion is coupled to the first electrode connection conductive portion through a connection via hole provided in the connection overlapping area;
   a second electrode of the second transistor is coupled to the first conductive connection portion.

5. The display substrate according to claim 4, wherein the at least one shift register unit includes a first transistor;
   the first electrode plate of the first capacitor includes a first horizontal plate portion and a first vertical plate portion;
   the gate electrode of the second capacitor connection transistor and the first horizontal plate portion are arranged along a first direction;
   a gate electrode of the first transistor, the gate electrode of the second transistor, and the first vertical plate portion are arranged along a first direction;
   the first vertical plate portion is located between the first capacitor connection transistor and the second capacitor connection transistor.

6. The display substrate according to claim 3, wherein a first electrode of the second capacitor connection transistor is coupled to the first voltage signal line;
   a maximum distance in the second direction between an orthographic projection of the gate electrode of the first capacitor connection transistor on the substrate and the orthographic projection of the first voltage signal line on the substrate is smaller than a maximum distance in the second direction between an orthographic projection of the gate electrode of the second capacitor connection transistor on the substrate and the orthographic projection of the first voltage signal line on the substrate.

7. The display substrate according to claim 3, wherein a maximum distance in the second direction between the gate electrode of the first capacitor connection transistor and the gate electrode of the second capacitor connection transistor is less than a second predetermined distance;
- an orthographic projection of the first electrode plate of the first capacitor on the substrate is within an orthographic projection of the second electrode plate of the first capacitor on the substrate;
- the first electrode plate of the first capacitor is of an L shape.

8. The display substrate according to claim 3, wherein the first capacitor connection transistor comprises a first active pattern; the first active pattern extends along the first direction;
- the first active pattern includes two first capacitor connection conductive portions arranged opposite to each other in the first direction, and a first capacitor connection channel portion located between the two first capacitor connection conductive portions.

9. The display substrate according to claim 1, wherein the first voltage signal line is located on a side of the second voltage signal line away from the display area.

10. The display substrate according to claim 1, further comprising a third voltage signal line;
- wherein the third voltage signal line is located on a side of the first voltage signal line away from the second voltage signal line;
- the first capacitor and the at least two transistors coupled to the same electrode plate of the first capacitor are located between the first voltage signal line and the third voltage signal line.

11. The display substrate according to claim 1, wherein the at least one shift register unit further comprises a first node control transistor and a second capacitor;
- a gate electrode of the first node control transistor is coupled to the second electrode plate of the second capacitor;
- an orthographic projection of the first electrode plate of the second capacitor on the substrate is within an orthographic projection of the second electrode plate of the second capacitor on the substrate;
- the first electrode plate of the second capacitor is of an L shape;
- the first electrode plate of the second capacitor includes a second horizontal plate portion;
- an orthographic projection of the gate electrode of the first node control transistor on the substrate and an orthographic projection of the second horizontal plate portion on the substrate are arranged in a first direction.

12. The display substrate according to claim 11, wherein the scan driving circuit further comprises a third voltage signal line; the third voltage signal line extends along the first direction; the third voltage signal line is located on a side of the first voltage signal line away from the display area;
- the first node control transistor is located between the third voltage signal line and the first voltage signal line;
- the first electrode plate of the second capacitor further includes a second vertical plate portion coupled to the second horizontal plate portion; an orthographic projection of the second vertical plate portion on the substrate partially overlaps an orthographic projection of the third voltage signal line on the substrate.

13. The display substrate according to claim 12, wherein the at least one shift register unit includes an output circuit;

the first clock signal line is located on a side of the third voltage signal line away from the first voltage signal line;
- the output circuit includes an output transistor; the at least one shift register unit further includes a second conductive connection portion arranged between a gate electrode of the output transistor and the second electrode plate of the second capacitor; the second conductive connection portion is respectively coupled to the gate electrode of the output transistor and the second electrode plate of the second capacitor;
- the at least one shift register unit further includes a third conductive connection portion coupled to the second electrode plate of the second capacitor;
- an orthographic projection of the third conductive connection portion on the substrate and the orthographic projection of the first clock signal line on the substrate have a second overlapping area, and the first clock signal line is coupled to the first electrode plate of the second capacitor through at least one second via hole provided in the second overlapping area.

14. The display substrate according to claim 11, wherein the first node control transistor comprises a second active pattern, the second active pattern is of a U shape;
- the second active pattern includes a first one of first node control channel portions, a second one of first node control channel portions, and a first one of first node control conductive portions coupled to the first one of first node control channel portions; and a second one of first node control conductive portions coupled to the second one of first node control channel portions;
- the gate electrode the first node control transistor includes a first gate pattern and a second gate pattern that are coupled to each other;
- the first gate pattern corresponds to the first one of first node control channel portions, and the second gate pattern corresponds to the second one of first node control channel portions;
- the first one of first node control conductive portions corresponds to a second electrode of the first node control transistor, and the second one of first node control conductive portions corresponds to a first electrode of the first node control transistor.

15. The display substrate according to claim 11, wherein the at least one shift register unit further comprises a second node control transistor; the at least one shift register unit comprises a second capacitor connection transistor;
- a second electrode of the second node control transistor and the second electrode of the first node control transistor are coupled through a fourth conductive connection portion;
- the at least one shift register unit further includes a fifth conductive connection portion coupled to a gate electrode of the second capacitor connection transistor; an orthographic projection of the fifth conductive connection portion on the substrate and an orthographic projection of the fourth conductive connection portion on the substrate have a third overlapping area;
- the fifth conductive connection portion is coupled to the fourth conductive connection portion through a third via hole provided in the third overlapping area.

16. The display substrate according to claim 15, wherein the scan driving circuit further comprises a third voltage signal line; the third voltage signal line is located on a side of the first voltage signal line away from the display area;
- the first electrode of the first node control transistor is coupled to a sixth conductive connection portion; the gate electrode of the second node control transistor is coupled to a seventh conductive connection portion;

an orthographic projection of the sixth conductive connection portion on the substrate and an orthographic projection of the seventh conductive connection portion on the substrate have a fourth overlapping area, and the sixth conductive connection portion is coupled to the seventh conductive connection portion through a fourth via hole provided in the fourth overlapping area;

the first electrode of the second node control transistor is coupled to the third voltage signal line.

17. The display substrate according to claim 15, wherein the gate electrode of the second node control transistor is coupled to an eighth conductive connection portion; an orthographic projection of the eighth conductive connection portion on the substrate and the orthographic projection of the second clock signal line on the substrate have a fifth overlapping area, and the eighth conductive connection portion is coupled to the second clock signal line through a fifth via hole provided in the fifth overlapping area.

18. The display substrate according to claim 1, wherein the scan driving circuit comprises a third voltage signal line; the third voltage signal line extends along the first direction;

an orthographic projection of the third voltage signal line on the substrate, an orthographic projection of the first clock signal line on the substrate, and an orthographic projection of the second clock signal line on the substrate are all located on a side of an orthographic projection of the plurality of shift register units on the substrate away from the display area of the display substrate;

the first clock signal line, the second clock signal line, and the third voltage signal line are arranged in sequence along a direction close to the display area; or the second clock signal line, the first clock signal line and the third voltage signal line are arranged in sequence along the direction close to the display area.

19. The display substrate according to claim 11, wherein the at least one shift register unit further comprises an input transistor;

a first electrode of the input transistor is coupled to the input signal end;

a second electrode of the input transistor is coupled to a ninth conductive connection portion, and an orthographic projection of the ninth conductive connection portion on the substrate and an orthographic projection of the second electrode plate of the second capacitor on the substrate have a sixth overlapping area, and the ninth conductive connection portion is coupled to the second electrode plate of the second capacitor through a sixth via hole provided in the sixth overlapping area.

20. The display substrate according to claim 11, wherein the at least one shift register unit further comprises a third node control transistor, a second capacitor connection transistor, and an input transistor;

a gate electrode the third node control transistor is coupled to the first clock signal line;

an active layer of the input transistor, an active layer of the third node control transistor, and an active layer of the second capacitor connection transistor are formed by a continuous third semiconductor layer;

the active layer of the input transistor includes a first one of fifth conductive portions, a fifth channel portion, and a second one of fifth conductive portions sequentially arranged along a first direction;

the second one of fifth conductive portions is reused as a first one of sixth conductive portions;

the active layer of the third node control transistor includes the first one of sixth conductive portions, a sixth channel portion, and a second one of sixth conductive portions sequentially arranged along the first direction;

the second one of sixth conductive portions is reused as a first one of seventh conductive portion;

the active layer of the second capacitor connection transistor includes the first one of seventh conductive portions, a seventh channel portion, and a second one of seventh conductive portions sequentially arranged along the first direction.

21. The display substrate according to claim 1, wherein the scan driving circuit further comprises a third voltage signal line; the at least one shift register unit further comprises an output transistor, an output reset transistor, an output capacitor, and a second capacitor, a first transistor, a second transistor, a first node control transistor, a second node control transistor, an input transistor, and a third node control transistor; the at least two transistors include a first capacitor connection transistor and a second capacitor connection transistor;

a first electrode of the output reset transistor is coupled to the first voltage signal line, a first electrode of the output transistor is coupled to the second voltage signal line; a second electrode of the output transistor and a second electrode of the output reset transistor are all coupled to the signal output line;

a second electrode of the first transistor is coupled to a second electrode plate of the output capacitor, a first electrode of the first transistor is coupled to the first voltage signal line, and a gate electrode the first transistor is coupled to a second electrode of the third node control transistor;

a second electrode of the second transistor is coupled to a first electrode plate of the first capacitor, a first electrode of the second transistor is coupled to a second electrode of the first capacitor connection transistor, and a gate electrode of the second transistor is coupled to a gate electrode of the third node control transistor;

a gate electrode the first capacitor connection transistor and a gate electrode of the second capacitor connection transistor are respectively coupled to a second electrode plate of the first capacitor; a second electrode of the first capacitor connection transistor is coupled to the first electrode plate of the first capacitor; a first electrode of the first capacitor connection transistor is coupled to the gate electrode of the second transistor;

a first electrode of the second capacitor connection transistor is coupled to the first voltage signal line; the gate electrode the second capacitor connection transistor is coupled to a second electrode of the second node control transistor; a second electrode of the second capacitor connection transistor is coupled to a first electrode of the third node control transistor;

a first electrode of the first node control transistor is coupled to a gate electrode the second node control transistor; a gate electrode of the first node control transistor is coupled to a second electrode plate of the second capacitor;

the second electrode of the second node control transistor is coupled to a second electrode of the first node control transistor; the gate electrode of the second node control transistor is coupled to the second clock signal line; a first electrode of the second node control transistor is coupled to the third voltage signal line;

a gate electrode of the input transistor is coupled to the gate electrode of the second node control transistor; a first electrode of the input transistor is coupled to the input signal end; a second electrode of the input transistor is coupled to the second electrode plate of the second capacitor;

the gate electrode of the third node control transistor is coupled to the first clock signal line;

a first electrode plate of the output capacitor is coupled to the first voltage signal line, and the second electrode plate of the output capacitor is coupled to a gate electrode of the output reset transistor;

the second electrode plate of the second capacitor is coupled to a gate electrode of the output transistor, and a first electrode plate of the second capacitor is coupled to the first clock signal line.

22. The display substrate according to claim 21, wherein the first electrode plate of the first capacitor comprises a first horizontal plate portion and a first vertical plate portion;

the output transistor and the output reset transistor are arranged between the first voltage signal line and the second voltage signal line; the output reset transistor, the output transistor and the signal output lines are arranged in sequence along the first direction;

the third voltage signal line is arranged on a side of the first voltage signal line away from the second voltage signal line; the first capacitor, the first transistor, the second transistor, the first capacitor connection transistor, the second capacitor connection transistor, the first node control transistor, the second node control transistor, the input transistor and the third node control transistor are all arranged between the first voltage signal line and the third voltage signal line;

the first transistor, the second transistor, and the first vertical plate portion are arranged in sequence along the first direction, the input transistor, the third node control transistor, the second capacitor connection transistor, and the first horizontal plate portion are arranged in sequence along the first direction, and the second node control transistor and the first node control transistor are arranged in sequence along the first direction;

an orthographic projection of the gate electrode of the first capacitor connection transistor on the substrate is arranged between an orthographic projection of the second electrode plate of the first capacitor on the substrate and an orthographic projection of the first voltage signal line on the substrate;

an orthographic projection of the gate electrode of the second transistor on the substrate is arranged between an orthographic projection of the gate electrode of the third node control transistor on the substrate and the orthographic projection of the first voltage signal line on the substrate;

an orthographic projection of the gate electrode of the first node control transistor on the substrate is arranged between an orthographic projection of the third voltage signal line on the substrate and an orthographic projection of the first electrode plate of the first capacitor on the substrate;

a minimum distance in the second direction between the orthographic projection of the gate electrode of the first node control transistor on the substrate and the orthographic projection of the third voltage signal line on the substrate is greater than a minimum distance in the second direction between the orthographic projection of the gate electrode of the second capacitor connection transistor on the substrate and the orthographic projection of the third voltage signal line on the substrate.

23. The display substrate according to claim 21, wherein an orthographic projection of the first electrode plate of the output capacitor on the substrate and an orthographic projection of the first voltage signal line on the substrate have a signal line overlapping area; an orthographic projection of the second electrode plate of the output capacitor on the substrate partially overlaps an orthographic projection of the first voltage signal line on the substrate;

an orthographic projection of the first electrode plate of the second capacitor on the substrate is within an orthographic projection of the second electrode plate of the second capacitor on the substrate; the first electrode plate of the second capacitor is of an L shape;

the first electrode plate of the second capacitor includes a second horizontal plate portion and a second vertical plate portion;

the gate electrode of the first node control transistor and the second horizontal plate portion are arranged along a first direction;

an orthographic projection of the second vertical plate portion on the substrate partially overlaps the orthographic projection of the third voltage signal line on the substrate.

24. The display substrate according to claim 1, wherein the display substrate further comprises a plurality of rows of pixel circuits arranged on the substrate; the pixel circuit comprises a light emitting control end;

the plurality of shift register units included in the scan driving circuit correspond to the plurality of rows of pixel circuit in a one-to-one manner;

the signal output line of the shift register unit is coupled to the light emitting control end of the corresponding row of pixel circuits, and is configured to provide a light emitting control signal to the light emitting control end of the corresponding row of pixel circuits.

25. A display device comprising the display substrate according to claim 1.

26. A method of manufacturing a display substrate, comprising forming a scan driving circuit on a substrate, and forming at least one driving transistor in a display area included in the display substrate; the driving transistor is configured to drive a light emitting element for display;

the scan driving circuit includes a plurality of shift register units, a first voltage signal line, a second voltage signal line, a first clock signal line, and a second clock signal line, at least one shift register unit of the plurality of shift register units includes a signal output line, a first capacitor, and at least two transistors coupled to a same electrode plate of the first capacitor; gate electrodes of the at least two transistors are respectively coupled to the same electrode plate of the first capacitor;

the method of manufacturing the display substrate further includes:

forming the first capacitor and the at least two transistors on the same side of the first voltage signal line;

arranging the first voltage signal line, the second voltage signal line, the first clock signal line, and the second clock signal line to extend along the first direction, and arranging the signal output line to extend along the second direction;

wherein the first direction intersects the second direction, and wherein a maximum distance in the second direction between an orthographic projection of the gate electrodes of the at least two transistors on the substrate and an orthographic projection of the first voltage signal line on the substrate is less than a first predetermined distance.

27. The method according to claim 26, wherein the first predetermined distance is greater than or equal to 30 microns and less than or equal to 40 microns.

28. The method according to claim 26, wherein the at least two transistors include a first capacitor connection transistor and a second capacitor connection transistor;
the forming the first capacitor connection transistor and the second capacitor connection transistor include:
forming an active layer of the first capacitor connection transistor and an active layer of the second capacitor connection transistor on the substrate;
forming a first gate metal layer on a side of the active layer away from the substrate, and performing a patterning process on the first gate metal layer to form a gate electrode of the first capacitor connection transistor, a gate electrode of the second capacitor connection transistor and a second electrode plate of the first capacitor, and the gate electrode of the first capacitor connection transistor and the gate electrode the second capacitor connection transistor are coupled to the second electrode plate of the first capacitor;
doping a portion of the active layer that is not covered by the gate electrode of the first capacitor connection transistor and the gate electrode of the second capacitor connection transistor by using the gate electrode of the first capacitor connection transistor and the gate electrode of the second capacitor connection transistor as a mask, so that the portion of the active layer that is not covered by the gate electrode of the first capacitor connection transistor and the gate electrode of the second capacitor connection transistor is formed as a conductive portion, and another portion of the active layer that is covered by the gate electrodes is formed as a channel portion; the active layer of the first capacitor connection transistor includes a first one of first capacitor connection conductive portions, a first capacitor connection channel portion, and a second one of first capacitor connection conductive portions arranged in sequence along the first direction; the active layer of the second capacitor connection transistor includes a first one of seventh conductive portions, a seventh channel portion and a second one of seventh conductive portions arranged sequentially along the first direction; the first one of first capacitor connection conductive portions is used as a first electrode of the first capacitor connection transistor, the second one of first capacitor connection conductive portions is used as a second electrode of the first capacitor connection transistor;
forming a second gate metal layer on a side of the first gate metal layer away from the active layer, and performing a patterning process on the second gate metal layer to form a first electrode plate of the first capacitor;
forming a source-drain metal layer on a side of the second gate metal layer away from the first gate metal layer, and performing a patterning process on the source-drain metal layer to form the first voltage signal line, the second voltage signal line and the first conductive connection portion;

wherein an orthographic projection of the first conductive connection portion on the substrate and an orthographic projection of the first electrode plate of the first capacitor on the substrate have a first overlapping area, and the first conductive connection portion is coupled to the first electrode plate of the first capacitor through at least one first via hole provided in the first overlapping area.

29. The method according to claim 28, wherein the first one of seventh conductive portion is used as the second electrode of the second capacitor connection transistor, and the second one of seventh conductive portions is used as the first electrode of the second capacitor connection transistor, and the first electrode of the second capacitor connection transistor is coupled to the first voltage signal line;
a maximum distance in the second direction between an orthographic projection of the gate electrode of the first capacitor connection transistor on the substrate and an orthographic projection of the first voltage signal line on the substrate is smaller than a maximum distance in the second direction between an orthographic projection of the gate electrode the second capacitor connection on the substrate and the orthographic projection of the first voltage signal line on the substrate.

30. The method according to claim 29, wherein a maximum distance in the second direction between the gate electrode of the first capacitor connection transistor and the gate electrode of the second capacitor connection transistor is less than a second predetermined distance;
an orthographic projection of the first electrode plate of the first capacitor on the substrate is arranged within an orthographic projection of the second electrode plate of the first capacitor on the substrate;
the first electrode plate of the first capacitor is of an L shape.

31. The method according to claim 28, wherein the at least one shift register unit may further include a first node control transistor and a second capacitor;
the forming the first node control transistor and the second capacitor includes:
forming an active layer of the first node control transistor on the substrate while forming the active layer of the first capacitor connection transistor and the active layer of the second capacitor connection transistor on the substrate;
performing a patterning process on the first gate metal layer to form a gate electrode of the first node control transistor and the second electrode plate of the second capacitor, and the gate electrode of the first node control transistor being coupled to the second electrode plate of the second capacitor;
doping a portion of the active layer of the first node control transistor that is not covered by the gate electrode of the first node control transistor using the gate electrode of the first node control transistor as a mask;
pattering the second gate metal layer to form a first electrode plate of the second capacitor, and an orthographic projection of the first electrode plate of the second capacitor on the substrate being within an orthographic projection of the second electrode plate of the second capacitor on the substrate; the first electrode plate of the second capacitor being of an L shape;
the first electrode plate of the second capacitor including a second horizontal plate portion; an orthographic projection of the gate electrode of the first node control transistor on the substrate an the orthographic projections of the second horizontal plate portion on the substrate being arranged along the first direction.

32. The method according to claim 31, further comprising:
performing a patterning process on the source-drain metal layer to form a third voltage signal line extending along the first direction;
the first node control transistor is located on a side of the second capacitor connection transistor away from the first voltage signal line; the first node control transistor is located between the third voltage signal line and the first voltage signal line;
the first electrode plate of the second capacitor further includes a second vertical plate portion coupled to the second horizontal plate portion; an orthographic projection of the second vertical plate portion on the substrate partially overlaps an orthographic projection of the third voltage signal line on the substrate.

33. A display substrate, comprising a scan driving circuit and a display area arranged on a substrate, wherein the scan driving circuit includes a plurality of shift register units; the scan driving circuit further includes a first voltage signal line, a second voltage signal line, a first clock signal line, and a second clock signal line; the first voltage signal line, the second voltage signal line, the first clock signal line, and the second clock signal line extend along a first direction; the display area includes at least one driving transistor configured to drive a light emitting element for display;
at least one shift register unit of the plurality of shift register units includes a signal output line, a first capacitor, and at least two transistors coupled to a same electrode plate of the first capacitor; the signal output line extends along a second direction, the first direction intersects the second direction;
gate electrodes of the at least two transistors are respectively coupled to the same electrode plate of the first capacitor, and both the first capacitor and the at least two transistors are arranged on a same side of the first voltage signal line,
wherein the at least one shift register unit further comprises a first node control transistor and a second capacitor;
a gate electrode of the first node control transistor is coupled to the second electrode plate of the second capacitor;
an orthographic projection of the first electrode plate of the second capacitor on the substrate is within an orthographic projection of the second electrode plate of the second capacitor on the substrate;
the first electrode plate of the second capacitor is of an L shape;
the first electrode plate of the second capacitor includes a second horizontal plate portion;
an orthographic projection of the gate electrode of the first node control transistor on the substrate and an orthographic projection of the second horizontal plate portion on the substrate are arranged in a first direction.

* * * * *